US012796027B2

(12) United States Patent
Kang et al.

(10) Patent No.: US 12,796,027 B2
(45) Date of Patent: Nov. 10, 2026

(54) BOTTOM ISOLATION EXTENSION REGION

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 18/497,311

(22) Filed: Oct. 30, 2023

(65) Prior Publication Data

US 2025/0142903 A1 May 1, 2025

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/116* (2025.01); *H10D 62/151* (2025.01); *H10D 64/017* (2025.01); *H10D 84/013* (2025.01); *H10D 84/0149* (2025.01); *H10D 84/0151* (2025.01); *H10D 84/038* (2025.01); *H10D 84/83* (2025.01)

(58) Field of Classification Search

CPC ........... H10D 30/6735; H10D 84/0151; H10D 30/014; H10D 30/43

See application file for complete search history.

(56) References Cited

U.S. PATENT DOCUMENTS

| | | | |
|---|---|---|---|
| 10,797,139 | B2 | 10/2020 | Morrow |
| 10,903,315 | B2 | 1/2021 | Loubet |
| 11,276,643 | B2 | 3/2022 | Huang |
| 11,437,283 | B2 | 9/2022 | Lilak |

(Continued)

FOREIGN PATENT DOCUMENTS

EP 4135019 A1 2/2023

*Primary Examiner* — Chad M Dicke
*Assistant Examiner* — Valerie N Newton
(74) *Attorney, Agent, or Firm* — Seed Intellectual Property Law Group LLP

(57) ABSTRACT

The embodiments of the present disclosure recognize the potential benefits of semiconductor IC device fabrication techniques to form a microdevice, such as a transistor, that includes structures, such as a source and/or drain, that are to be connected to a backside contact that is further associated with a backside back end of line (BEOL) network. The semiconductor IC device includes a bottom isolation extension (BIE) region. The BIE region is formed within a gate structure of the microdevice and may be located between the backside contact and the gate structure. The BIE region may provide for increased electrical isolation between the backside contact and the gate structure.

18 Claims, 16 Drawing Sheets

(56) References Cited

U.S. PATENT DOCUMENTS

| | | | | |
|---|---|---|---|---|
| 2017/0077314 | A1 | 3/2017 | Smith | |
| 2021/0111115 | A1 | 4/2021 | Morrow | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0336012 | A1 * | 10/2021 | Huang | H10D 64/01 |
| 2021/0351303 | A1 | 11/2021 | Ju | |
| 2021/0376071 | A1 | 12/2021 | Liu | |
| 2021/0376093 | A1 | 12/2021 | Chu | |
| 2022/0216340 | A1 | 7/2022 | Lin | |
| 2022/0336287 | A1 * | 10/2022 | Yu | H10D 84/0158 |
| 2023/0067804 | A1 | 3/2023 | Shen | |
| 2023/0123733 | A1 | 4/2023 | Yu | |

* cited by examiner

100

BOTTOM ISOLATION EXTENSION REGION

BACKGROUND

A backside back-end-of-line (BEOL) network, such as a backside power distribution network (BSPDN) may include signal wires for signal routing and power wires for providing power potential (e.g., VDD, VSS, etc.). The backside BEOL network may allow for the distribution of power wires and signal wires between both the frontside and backside of the semiconductor IC device. The backside BEOL network may further allow for the full or partial decoupling of signal routing and/or power routing and/or allows for dividing or splitting power wires and/or signal wires between both the frontside and backside of the semiconductor IC device. By incorporating the backside BEOL network, routing congestion may be reduced, which may lead to further semiconductor IC device scaling. For example, semiconductor IC devices that incorporate a backside BEOL network can result in a 30% area reduction and improved current-resistance (IR) drop compared to typical semiconductor IC devices that include solely a frontside BEOL network.

However, the backside BEOL network may be difficult to manufacture as it requires structures of various microdevices, such as a transistor source, drain, and/or gate, to connect the backside wires of the backside BEOL network. Particularly, there are difficulties in providing for adequate electrical isolation between a backside contact, such as a backside source/drain contact, that is connected to the backside BEOL network and a gate structure that is associated with the source/drain contact.

SUMMARY

In an embodiment of the present disclosure, a semiconductor integrated circuit (IC) device is presented. The semiconductor IC device includes a transistor comprising a plurality of nanosheet channels. The semiconductor IC device further includes a bottom isolation structure below the plurality of nanosheet channels. The semiconductor IC device further includes a bottom isolation extension (BIE) region in direct contact against at least a sidewall of the bottom isolation structure. The semiconductor IC device further includes a gate structure in direct contact against the BIE region and in direct contact against the plurality of nanosheet channels. In this manner, the bottom isolation structure is effectively extended by the BIE region and, as such, provides for relatively increased electrical isolation between the gate structure and other components of the semiconductor IC device.

In an example, the semiconductor IC device further includes a source/drain (S/D) region in direct contact against the plurality of nanosheet channels and a backside contact in direct contact against the S/D region. In this manner, at least one component of the transistor is associated with a backside contact, as opposed to all the components of the transistor being associated with e.g., a respective frontside contact. As such, signal and/or power wiring routing complexities to and from the components of the transistor may be relatively reduced.

In an example, the BIE region is further in direct contact against the backside contact. In this manner, the BIE region provides for relatively increased electrical isolation between the gate structure and other components of the backside contact.

In an example, the semiconductor IC device further includes a backside back end of line (BEOL) network in direct contact against the backside contact. By associating the backside contact with the backside BEOL network, the presented semiconductor IC device may be further scaled and/or may have reduced signal and/or power wiring routing complexities therein.

In an example, the semiconductor IC device further includes a shallow trench isolation (STI) region underneath the gate structure. The STI region may advantageously and adequately electrically isolate the active regions of the transistor from a neighboring or adjacent transistor.

In an example, a bottom surface of the BIE region is substantially coplanar with a bottom surface of the gate structure. In this manner, the BIE region may be formed from the backside of the semiconductor IC device by forming a BIE region opening that is at least partially defined by the STI region, which also effectively defines the bottom surface of the gate structure, and by filling the BIE region opening with a dielectric or other electrical isolation material.

In an example, a top surface of the STI region is substantially coplanar with the bottom surface of the gate structure and is below a bottom surface of the bottom isolation structure. In this manner, the STI region may effectively define the bottom surface of the gate structure. Due to the top surface of the STI region being below the bottom surface of the bottom isolation structure, at least a portion of the gate structure may be exposed by the removal of an associated substrate structure. The exposed portion of the gate structure may provide for the BIE region opening to be formed within the gate structure.

In an example, the STI region is in direct contact against the backside contact. In this manner, the STI region may effectively define a sidewall or side surface of the backside contact.

In an example, the BIE region is composed of a first material, and the bottom isolation structure is composed of a second material that is different from the first material. In this way, the material of the BIE region may specifically be chosen at least in part to achieve predetermined isolation objectives per expected BIE region geometry and need not be limited to the material of the bottom isolation structure. Further, as the BIE region may be fabricated in distinct fabrication stages relative to the bottom isolation structure, the material of the BIE region need not be limited to the material of the bottom isolation structure.

In another embodiment of the present disclosure, a semiconductor integrated circuit (IC) device is presented. The semiconductor IC device includes a first transistor, a second transistor, a shallow trench isolation (STI) region, and a gate structure. The first transistor is associated with a first active region and includes a first plurality of nanosheet channels, a first bottom isolation structure below the first plurality of nanosheet channels, and a first bottom isolation extension (BIE) region in direct contact against at least a sidewall of the first bottom isolation structure. The second transistor is associated with a second active region and includes a second plurality of nanosheet channels, a second bottom isolation structure below the first plurality of nanosheet channels, and a second bottom isolation extension (BIE) region in direct contact against at least a sidewall of the second bottom isolation structure. The STI region is between the first active region and the second active region. The gate structure is in direct contact against the first BIE region, is in direct contact against the first plurality of nanosheet channels, is in direct contact against the second BIE region, is in direct contact against the second plurality of nanosheet channels, and is in direct contact against the STI region. In this manner, the first and second bottom isolation structures are effectively extended by the first and second BIE region, respectively and, as such, provides for relatively increased electrical isolation between the gate structure and other components of the semiconductor IC device.

In an example, the first transistor further comprises a first source/drain (S/D) region that is in direct contact against the first plurality of nanosheet channels and the second transistor further comprises a second S/D region in direct contact against the second plurality of nanosheet channels. In this manner the first and second transistors include further functional components for transistor operations.

In an example, the semiconductor IC device further includes a first backside contact in direct contact against the first S/D region and a second backside contact in direct contact against the second S/D region. In this manner, at least one component of the transistors is associated with a backside contact, respectively, as opposed to all the components of the transistor being associated with e.g., a respective frontside contact. As such, signal and/or power wiring routing complexities to and from the components of the transistor may be relatively reduced.

In an example, the semiconductor IC device further includes a backside interlayer dielectric (ILD), wherein the first BIE region is further in direct contact against the first backside contact, and wherein the backside ILD is between the second BIE region and the second S/D contact. In this manner, the backside ILD may electrically isolation the backside contacts from one another and/or from other components of the semiconductor IC device.

In an example, the semiconductor IC device further includes a backside back end of line (BEOL) network in direct contact against the first backside contact and in direct contact against the second S/D contact. By associating the backside contacts with the backside BEOL network, the presented semiconductor IC device may be further scaled and/or may have reduced signal and/or power wiring routing complexities therein.

In an example, a bottom surface of the first BIE region, a bottom surface of the second BIE region, and a bottom surface of the gate structure are substantially coplanar. In this manner, the BIE regions may be formed from the backside of the semiconductor IC device by forming a respective BIE region opening that is at least partially defined by the STI region, which also effectively defines the bottom surface of the gate structure, and by filling the BIE region opening with a dielectric or other electrical isolation material.

In an example, a top surface of the STI region is substantially coplanar with the bottom surface of the gate structure and wherein the top surface of the STI region is below a bottom surface of the first bottom isolation structure and the second bottom isolation structure. In this manner, the STI region may effectively define the bottom surface of the gate structure. Due to the top surface of the STI region being below the bottom surface of the bottom isolation structure, at least a portion of the gate structure may be exposed by the removal of an associated substrate structure. The exposed portion of the gate structure may provide for the BIE region opening to be formed within the gate structure.

In an example, the STI region is in direct contact against the first backside contact and is in direct contact against the second backside contact. In this manner, the STI region may effectively define a sidewall or side surface of the backside contact.

In an example, the first BIE region and the second BIE region are composed of a first material, the first bottom isolation structure is composed of a second material, and wherein the first material is different than the second material. In this way, the material of the BIE regions may specifically be chosen at least in part to achieve predetermined isolation objectives per expected BIE region geometry and need not be limited to the material of the bottom isolation structure. Further, as the BIE region may be fabricated in distinct fabrication stages relative to the bottom isolation structure, the material of the BIE region need not be limited to the material of the bottom isolation structure.

In yet another embodiment of the present disclosure, a semiconductor integrated circuit (IC) device fabrication method is presented. The method includes forming a gate structure upon and around channels and upon a bottom isolation structure of a first transistor, forming a bottom isolation extension (BIE) region opening within the gate structure, the BIE region opening exposing at least a sidewall of the bottom isolation structure, and forming a BIE region by depositing dielectric material within the BIE region opening. In this manner, the bottom isolation structure is effectively extended by the BIE region, and as such, provides for relatively increased electrical isolation between the gate structure and other components of the semiconductor IC device.

In examples, the BIE region is in direct contact against the sidewall of the bottom isolation structure and is indirect contact with the gate structure. In this manner, the bottom isolation structure is effectively extended from the sidewall of the BIE region, and as such, provides for relatively increased electrical isolation between the gate structure and other components of the semiconductor IC device.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
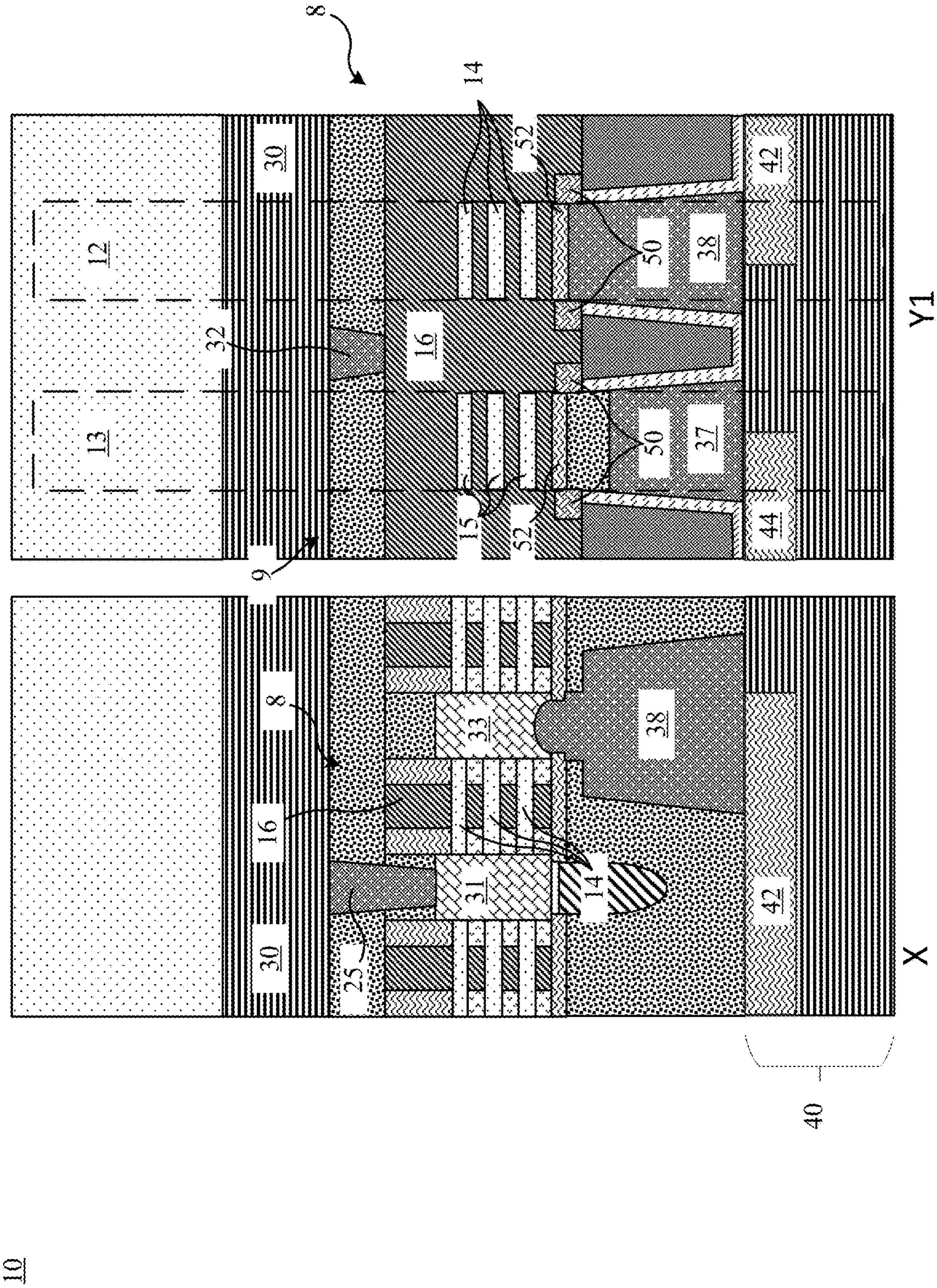
FIG. 1 depicts cross-section views of a semiconductor IC device that includes one or more bottom isolation extension (BIE) regions, according to one or more embodiments of the disclosure.

The embodiments of the present disclosure relate to fabrication methods and resulting structures for semiconductor devices. More specifically, the present disclosure relates to fabrication methods and resulting semiconductor integrated circuit (IC) devices that include bottom isolation extension (BIE) regions. In some examples, the BIE regions may provide for increased electrical isolation between a backside contact and a gate structure.

A gate structure, which may also be referred to herein as a gate, is typically a component of a transistor. A transistor is a type of microdevice that may be fabricated in semiconductor IC device front-end-of-line (FEOL) fabrication operations. Conventional transistors, or the like, incorporate planar field effect transistors (FETs) in which current flows through a semiconducting channel between a source and a drain, in response to a voltage applied to the gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes. A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

One technology change modified the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanolayers, nanosheets, or the like, that are isolated from the substrate. In the GAA FET, channel surfaces are in respective contact with the source and drain and other respective channel surfaces are in contact with and surrounded by the gate.

The flowcharts and cross-sectional diagrams in the drawings illustrate a method of fabricating a semiconductor IC device, such as a processor, filed programmable gate array (FPGA), memory module, or the like. In some alternative implementations, the fabrication steps may occur in a different order that that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" if the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all the points of both of the surfaces. Accordingly, two surfaces may be referred to as substantially coplanar despite deviations from coplanarity, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor devices are well known and so, in the interest of brevity, many conventional steps will only be mentioned briefly herein or will be omitted entirely without providing the well-known process details.

In general, the various processes used to form a semiconductor IC device that may be packaged into an IC package fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of a FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure, such as a nano wire, nano ribbon, nanolayer, nanosheet, or the like, hereinafter referred to as a nanolayer. For example, a GAA FET provides a relatively small FET footprint by forming the channel region as a series of vertically stacked nanolayers. In a GAA configuration, a GAA FET includes a source region, a drain region and vertically stacked nanolayer channels between the source and drain regions. These devices typically include one or more suspended nanolayers that serve as the channel. A gate surrounds the stacked nanolayers and regulates electron flow through the nanolayers between the source and drain regions. GAA FETs may be fabricated by forming alternating layers of active nanolayers and sacrificial nanolayers. The sacrificial nanolayers are released from the active nanolayers before the FET device is finalized. For n-type FETs, the active nanolayers are typically silicon (Si) and the sacrificial nanolayers are typically silicon germanium (SiGe). For p-type FETs, the active nanolayers can be SiGe and the sacrificial nanolayers can be Si. In some implementations, the active nanolayers of a p-type FET can be SiGe or Si, and the sacrificial nanolayers can be Si or SiGe. Forming the nanolayers from alternating layers of active nanolayers formed from a first type of semiconductor material (e.g., Si for n-type FETs, and SiGe for p-type FETs) and sacrificial nanolayers formed from a second type of semiconductor material (e.g., SiGe for n-type FETs, and Si for p-type FETs) may provide for superior channel electrostatics control, which is necessary for continuously scaling gate lengths.

For some transistors, integration of the transistors with a backside back-end-of-line (BEOL) network is one of the key challenges to providing increasing packaged IC device densities and performance increases. By incorporating a backside BEOL network into the semiconductor IC device, routing congestion may be eased. Currently, there is a need for semiconductor IC device fabrication techniques that include structures to adequately protect against a backside contact from shorting with an associated gate.

Referring now to FIG. 1, cross-sectional views of an illustrative semiconductor integrated circuit (IC) device 10 that includes one or more BIE regions 50 are depicted. Semiconductor IC device 10 may further include a first transistor 8 and a second transistor 9. Transistor 8 and transistor 9 may share a gate 16 that is around and that contacts each of a first series of vertically stacked channels 14 of the first transistor 8 and that is around and that contacts each of a second series of vertically stacked channels 15 of the second transistor 9. Transistors 8, 9 may include respective source/drain regions. For example, and as is depicted, transistor 8 may include source/drain regions 31, 33 that are connected to respective end surfaces of the first series of vertically stacked channels 14. Similarly, transistor 9 may include source/drain regions (not shown) that are connected to respective end surfaces of the second series of vertically stacked channels 15.

The transistors 8, 9 may further include a bottom isolation structure that is located between the vertically stacked channels 14 and a backside contact 38. As depicted, the bottom isolation structure may be a bottom dielectric isolation (BDI) structure 52 that is typically formed along with gate spacers internal to which the gate is formed. Alternatively, the bottom isolation structure may also be a bottom spacer isolator (BSI) that is typically formed along with inner spacers that are under the gate spacers and are in between the vertically stacked channels. The bottom isolation structure may separate and electrically isolate the gate 16 from one or more backside contacts, e.g., backside contact 37, 38. However, in some implementations, shorting between the backside contact and the gate may occur when a top surface of the backside contact(s) has the potential to be formed above a bottom surface of the gate 16. In at least these implementations, the addition of the one or more BIE regions 50 may further reduce the propensity of shorting between the backside contact and the gate. For example, as depicted in the Y1 cross-section view, BIE regions 50 are located between the gate 16 and the backside contact 38 and may provide adequate electrical isolation therebetween, even when a top surface of the backside contact 38 is above the bottom surface of the gate 16.

The first series of vertically stacked channels 14 may be included in a first active region 12. In some implementations, a channel width of the first series of vertically stacked channels 14 may define the width of the first active region 12. Similarly, the second series of vertically stacked channels 15 may be included in a second active region 13, in which the channel width of the second series of vertically stacked channels 15 may define the width of the second active region 13.

The gate 16 may be connected to a frontside contact 32. The frontside contact 32 may be a middle-of-line (MOL) type contact that connects the gate 16 with a frontside back-end-of-line (BEOL) network 30 or alternatively may be an interconnect within a lowest level of the frontside BEOL network 30. In some embodiments of the disclosure, and as depicted, the frontside contact 32 may be located between the first active region 12 and the second active region 13.

The frontside BEOL network 30 may be connected to one or more of the S/D regions 31 by a frontside contact 25. As depicted, the frontside contact 25 may be a MOL type contact that connects the one or more of the S/D regions 31 with the frontside BEOL network 30. A backside BEOL network 40 may be connected to one or more of the S/D regions 33 by a backside contact 38. As depicted, the backside contact 38 may be a MOL type contact. In other implementations, the backside contact 38 may be an interconnect within a lowest level of the backside BEOL network 40. The backside BEOL network 40 may include a conductive path 42 (e.g., a first group of one or more first backside wires) that is connected with the backside contact 38 and may include a conductive path 44 (e.g., a second group of one or more backside wires different than those in the first group of one or more first backside wires) that is connected with the backside contact 37. For example, a first backside power wire, which may also be referred to as a rail, may be connected to backside contact 38 and a second backside power wire may be connected to backside contact 37.

For clarity, the first active region 12 and the second active region 13 are illustrative boundaries for the first transistor 8 and the second transistor 9, respectively. In some embodiments, the first transistor 8 may be a p-type transistor and the second transistor 9 may be an n-type transistor, or vice versa. Between these adjacent boundaries may be a median region, which may be defined by an STI region that is underneath the gate 16 and between the first and second series of vertically stacked channels 14, 15 and associated S/D regions.

Figure 2:
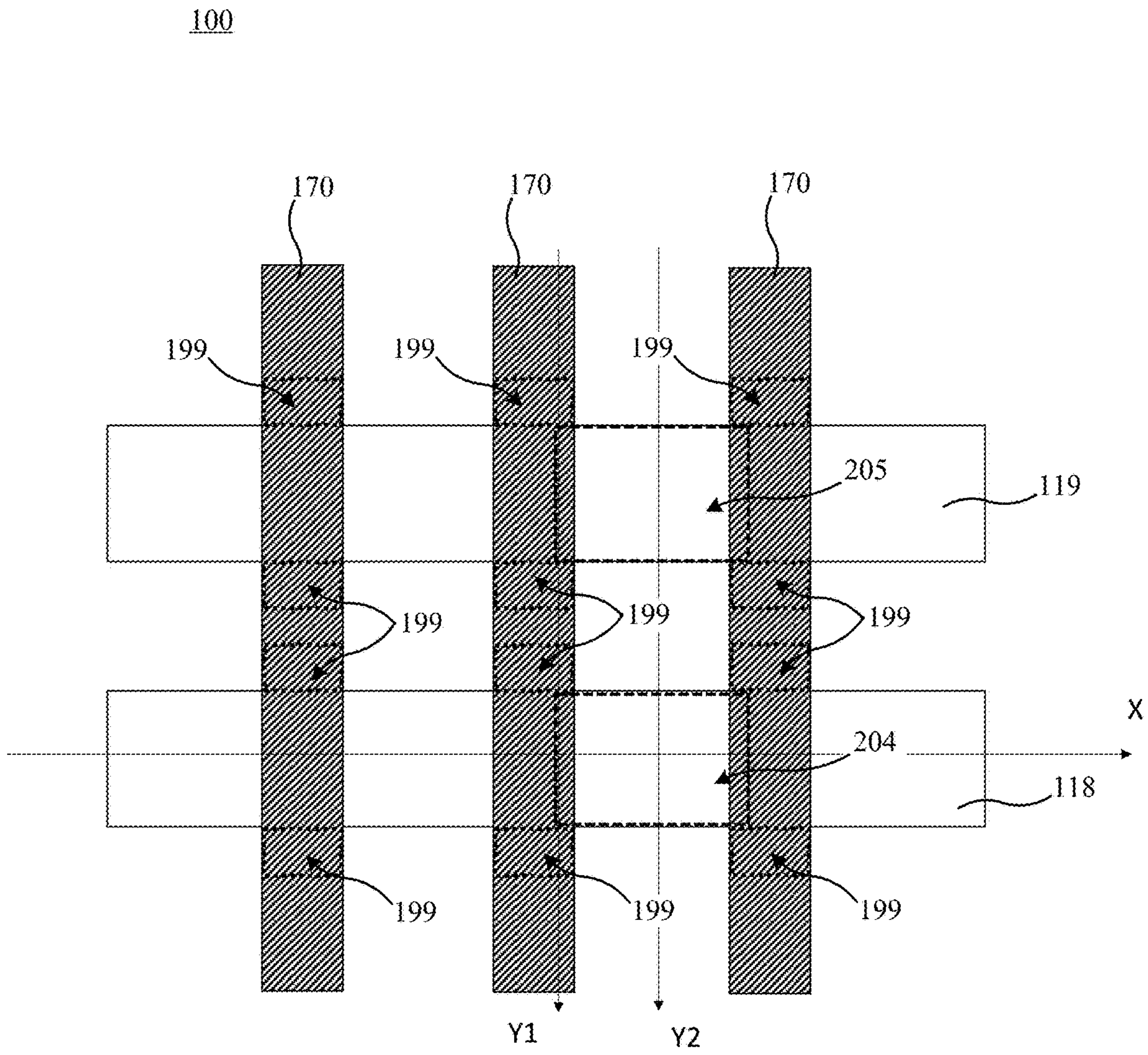
FIG. 2 depicts a partial top-down view of a semiconductor IC device that includes one or more BIE regions, according to one or more embodiments of the disclosure.

FIG. 2 depicts a partial top-down view of a semiconductor IC device 100 that includes one or more BIE regions, according to one or more embodiments of the disclosure. Semiconductor IC device 100 includes one or more BIE regions 199 and may further include active region 118, active region 119, replacement gate structures 170, backside contact 204, and/or backside contact 205. For clarity, respective perimeters and/or respective areas (not necessarily laying on the same plane) of the BIE regions 199, active region 118, active region 119, replacement gate structures 170, backside contact 204, and/or backside contact 205 are depicted in FIG. 2. Generally, the BIE regions 199 are in line with respective replacement gate structures 170 and between the associated replacement gate structures 170 and backside contact(s) 204, 205. BIE regions 199 may provide adequate electrical isolation between the replacement gate structures and one or more backside contacts, even when a top surface of a backside contact is above a bottom surface of the replacement gate structures 170.

For clarity, FIG. 2 also depicts respective locations of cross-sectional plane X, cross-sectional plane Y1, and cross-sectional plane Y2. For example, cross-sectional plane X is a vertical plane across active region 118 and adjacent replacement gate structures 170, cross-sectional plane Y1 is a vertical plane at an edge of and across one replacement gate structure 170, across active region 118, and across active region 119, and cross-sectional plane Y2 is a vertical plane across active region 118 and active region 119 between adjacent replacement gates 170. Cross-sectional plane X may be orthogonal to cross-sectional planes Y1, Y2. Cross-sectional planes Y1 and Y2 may be parallel.

Figure 3:
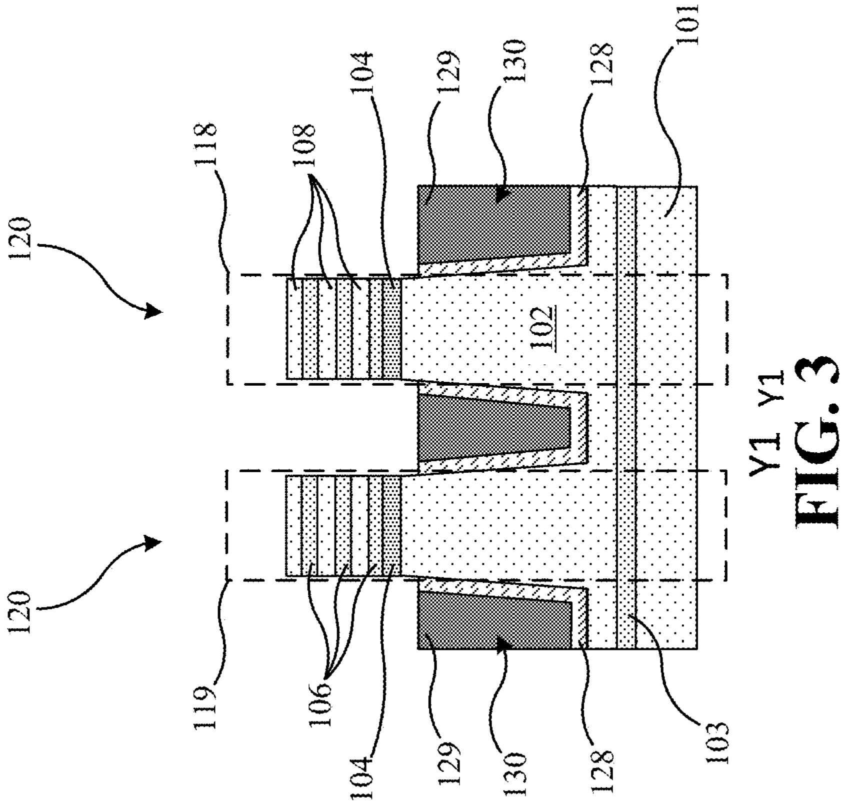
FIG. 3 through FIG. 14 depict various fabrication structure cross-section views of an exemplary semiconductor IC device that includes one or more BIE regions, according to one or more embodiments of the disclosure.

FIG. 3 depicts a cross-sectional view of a semiconductor IC device 100 that is to include one or more BIE regions after initial fabrication operations, in accordance with embodiments of the present disclosure. In these initial fabrication stages, nanolayers are formed upon a substrate structure, the nanolayers are patterned into nanolayer stacks, and shallow trench isolation (STI) regions are formed.

The substrate structure may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In the depicted implementation, the substrate structure includes an upper substrate 102, a lower substrate 101, and an etch stop layer 103 between the upper substrate 102 and the lower substrate 101. The upper substrate 102 and the lower substrate 101 may be comprised of any other suitable material(s) than those listed above, and the etch stop layer 103 may be a dielectric material with etch selectivity to one or both of the upper substrate 102 and/or the lower substrate 101. In one example, the etch stop layer 103 may be an oxide and the substrate structure may be referred to as a buried oxide (BOX) substrate. In another example, the lower substrate 101 may be composed of Si. The etch stop layer 103 may be composed of Silicon Germanium (SiGe) and may be epitaxially grown from the top surface of lower substrate 101 and the upper substrate 102 may be composed of Si and may be epitaxially grown from the top surface of etch stop layer 103.

Nanolayers may be formed over the substrate structure by forming a bottom sacrificial nanolayer 104 and by forming a series of alternating sacrificial nanolayers 106 and active nanolayers 108 thereupon. In certain examples, the bottom sacrificial nanolayer 104 is initially formed directly on an upper surface of the substrate structure. In other examples, certain layer(s) may be formed between the upper surface of the substrate structure and the bottom sacrificial nanolayer 104. In an example, the bottom sacrificial nanolayer 104 may be formed by epitaxially growing a SiGe layer with high Ge %, ranging from 50% to 70%. The bottom sacrificial nanolayer 104 may have etch selectivity relative to the sacrificial nanolayers 106 and active nanolayers 108.

The nanolayers may be further formed by fabricating the alternating series of sacrificial nanolayers 106, such as SiGe sacrificial nanolayers, and active nanolayers 108, such as Si nanolayers, upon the bottom sacrificial nanolayer 104. The sacrificial nanolayers 106 can have Ge % ranging from 20% to 45%. In an implementation, the alternating active sacrificial nanolayer 106 and active nanolayer 108 may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In the illustrated semiconductor IC device 100, there are a total of three sacrificial nanolayers 106 and three active nanolayers 108. However, it should be appreciated that any suitable number of alternating nanolayers may be formed. Although it is specifically contemplated that the bottom sacrificial nanolayer 104 and the sacrificial nanolayers 106 can be formed from SiGe and that the active nanolayers 108 can be formed from Si, it should be understood that any appropriate materials can be used instead, as long as the semiconductor materials have etch selectivity with respect to one or more of the others, as is consistent with the description of the fabrication stages herein.

Although it is specifically contemplated that the bottom sacrificial nanolayer 104, the sacrificial nanolayers 106, and the active nanolayers 108 are formed by epitaxial growth, such nanolayers can be formed by any appropriate mechanism, such as chemical vapor deposition (CVD), physical vapor deposition (PVD), atomic layer deposition (ALD), or gas cluster ion beam (GCIB) deposition, or the like.

In certain embodiments, the nanolayers have a vertical thickness ranging, for example, from approximately 3 nm to approximately 20 nm. In certain embodiments, the nanolayers have a vertical thickness ranging, for example, from approximately 3 nm to approximately 10 nm. Although the range of 3-20 nm is cited as an example range of thickness of the nanolayers, other thickness of these nanolayers may be used. In certain examples, certain of the nanolayers may have different thicknesses relative to one another. In certain examples, it may be desirable to have a small vertical spacing (VSP) between adjacent active nanolayers 108 to reduce the parasitic capacitance and to improve circuit speed. For example, the VSP (the distance between vertically adjacent active nanolayers 108) may range from 5 nm to 15 nm. However, the VSP must be of a sufficient value to accommodate the formation of a gate that is to be formed in the spaces created by later removal of respective portions of the sacrificial nanolayers 106.

Further, in the depicted fabrication stages, the nanolayers may be patterned into nanolayer stacks 120 and shallow trench isolation (STI) regions 130 may be formed.

To form one or more nanolayer stacks 120, a mask layer (not shown) may be formed on the uppermost nanolayer. The mask layer may be comprised of any suitable mask material(s). The mask layer may be patterned and used to perform the nanolayer stack 120 patterning process. In the nanolayer stack 120 patterning process, any suitable material removal process (e.g., reactive ion etching or RIE) may be used to remove portions of the alternating nanolayers down to the level of the substrate structure, or the like. Following the nanolayer stack 120 patterning process, one or more nanolayer stacks 120 are formed. Subsequently, the mask layer may be removed. A horizontal width of a first nanolayer stack 120 may define a width of a first active region 118 and a horizontal width of a second nanolayer stack 120 may define a width of a second active region 119.

The removal of undesired portion(s) of the alternating nanolayers may further remove undesired portions of substrate structure that are adjacent to respective footprints of nanolayer stacks 120 to form STI region openings. The etch may be timed or otherwise controlled to stop the removal of the substrate structure such that the depth or bottom of the one or more STI region openings has a predetermined or desired dimension. For example, the depth or bottom of the one or more STI region openings may be above the etch stop layer 103, as depicted. In some examples, the etch to form the nanolayer stacks 120 may utilize the etch stop layer 103 to stop the etch and form the bottom well of the one or more STI region openings.

A STI region 130 may be formed upon and/or within the substrate structure within respective STI region openings. The STI regions 130 may be formed by depositing electrical dielectric material(s) within respective STI region opening(s) that are adjacent to the one or more nanolayer stacks 120. A top surface of the one or more STI regions 130 may be initially coplanar with or below a top surface of the substrate structure. In some implementations, further fabrication operations may generally remove portions of the STI regions 130 (e.g., sacrificial gate removal, replacement gate fabrication pre-clean, etc.), such that the top surfaces of the STI regions 130 are below the top surface of the substrate structure.

The one or more STI regions 130 may have a volume and/or geometry that sufficiently electrically isolates components or features of neighboring transistors, or the like, may sufficiently electrically isolate neighboring nanolayer stacks 120, and/or may sufficiently electrically isolate neighboring active regions 118, 119. For clarity, a particular STI region 130 may separate and adequately electrically isolate neighboring active regions 118, 119.

In an example, the STI region(s) 130 may be formed by depositing a STI liner 128 within the STI region openings. Subsequently, STI region(s) 130 may be further formed by depositing STI dielectric material 129 upon the STI liner 128. A etch back, recess, or the like, may occur to remove undesired or over formed STI liner 128 and/or STI dielectric material 129, such that the top surface of the STI region(s) 130 are coplanar with or below a bottom surface of the bottom sacrificial nanolayer 104. STI liner 128 may be composed of but not limited to a nitride, low-κ nitride (i.e., a nitride material with a lower dielectric constant relative to $SiO_2$), or the like. The STI dielectric material 129 may be composed of but not limited to an oxide, low-κ oxide (i.e., an oxide material with a lower dielectric constant relative to $SiO_2$), or the like. For clarity, as the STI regions 130 are formed within the substrate structure upon which the microdevices may be formed, the STI regions 130 may generally be located below or underneath the microdevices.

Figure 4:
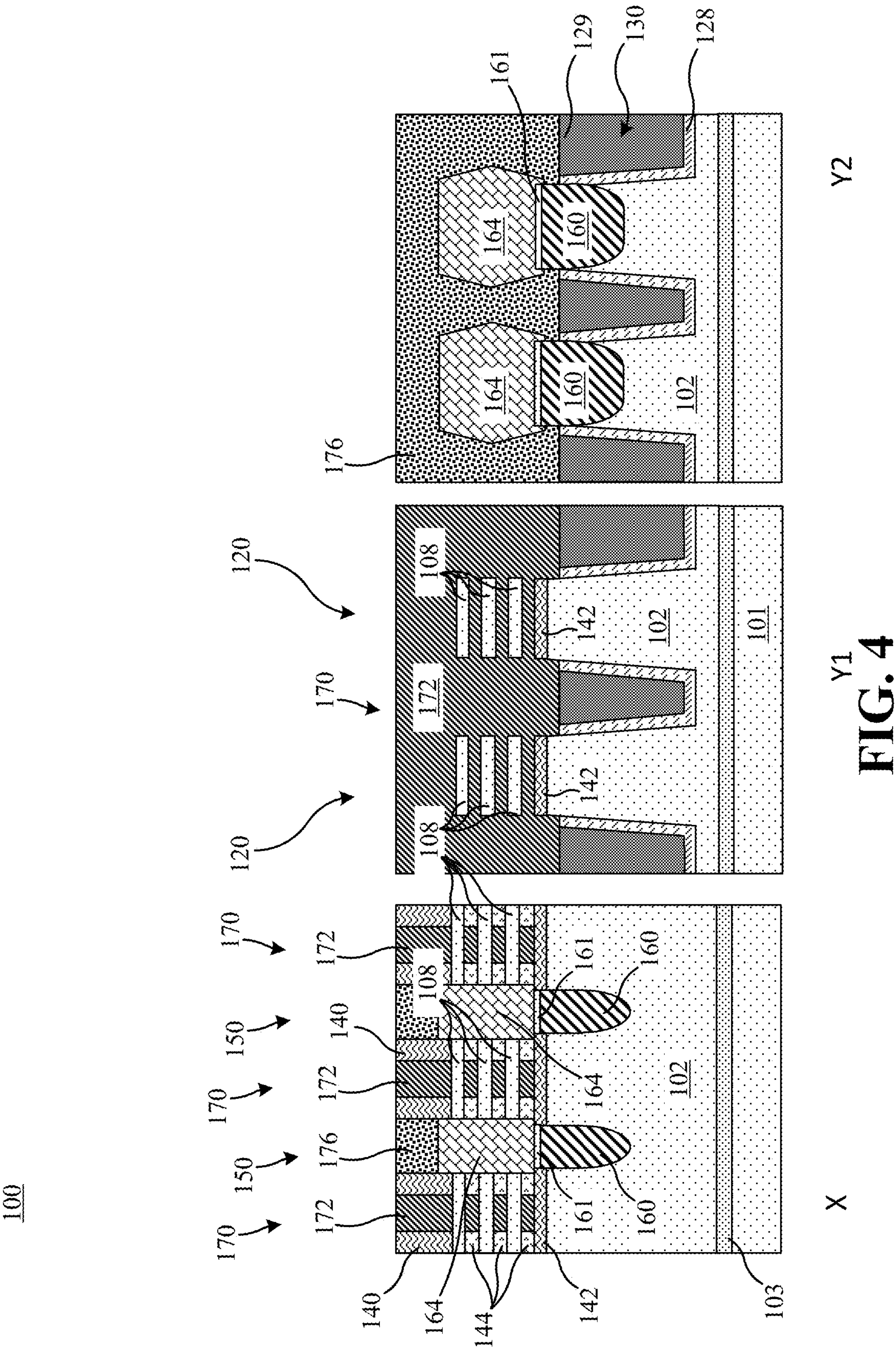

FIG. 4 depicts cross-sectional views of the semiconductor IC device 100 after fabrication operations, in accordance with embodiments of the present disclosure. In the depicted fabrication stages, one or more sacrificial gate structures (not shown) may be formed. Further in the depicted fabrication stages, the bottom sacrificial nanolayer may be removed, gate spacers 140 may be formed, and bottom dielectric isolation (BDI) region(s) may be formed. Further in the depicted fabrication stages, source/drain (S/D) recesses may be formed within the one or more nanolayer stacks between the gate spacers of neighboring sacrificial gate structures. Further in the depicted fabrication stages, the sacrificial nanolayers may be indented and a respective inner spacer may be formed within respective indents. Further in the depicted fabrication stages, one or more backside contact placeholders may be formed. Further in the depicted fabrication stages, S/D regions may be formed. Further in the depicted fabrication stages, an interlayer dielectric (ILD) may be formed. Further in the depicted fabrication stages, the sacrificial gate structures may be removed, and replacement gate structures may be formed in place thereof.

In the depicted fabrication stages, one or more sacrificial gate structures (not shown) may be formed and may include a sacrificial gate liner (not shown), a sacrificial gate (not shown), and a sacrificial gate cap (not shown). The sacrificial gate structures may be formed by initially depositing a sacrificial gate liner layer (e.g., a dielectric, oxide, or the like) upon the one or more STI regions 130, upon and around the one or more nanolayer stacks 120. The sacrificial gate structures may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks 120. The sacrificial gate structures may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 100.

The one or more sacrificial gate structures may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate (not shown), and the sacrificial gate cap (not shown), respectively, of each of the one or more sacrificial gate structures.

One or more sacrificial gate structures can be formed on targeted regions or areas of semiconductor IC device 100 to define the length of one or more GAA FETs and to provide sacrificial material for yielding targeted GAA FET structure(s) in subsequent processing. According to an example, each sacrificial gate structure can have a height of between approximately 50 nm and approximately 200 nm, and a length of between approximately 10 nm and approximately 200 nm.

Further in the depicted fabrication stages, the bottom sacrificial nanolayer 104 (shown in FIG. 3) may be selectively removed. The bottom sacrificial nanolayer 104 may be removed by a wet etch utilizing an etchant that targets the material of the bottom sacrificial nanolayer 104 selective to the respective material(s) of the sacrificial nanolayers 106 (shown in FIG. 3), the active nanolayers 108, STI region(s) 130, and/or sacrificial gate structures, as appropriate. The etch may be timed or otherwise controlled to effectively remove the bottom sacrificial nanolayer 104 while substantially retaining the sacrificial nanolayers 106, the active nanolayers 108, the STI region(s) 130, and the sacrificial gate structures, etc. The removal of bottom sacrificial nanolayer 104 may form a bottom dielectric isolation (BDI) cavity between the substrate structure and the bottommost sacrificial nanolayer 106.

Further in the depicted fabrication stages, gate spacers 140 and BDI region 142 may be formed. One BDI region 142 may be formed within a respective BDI cavity within the one or more nanolayer stacks 120. The gate spacer(s) 140 may be formed upon the sidewall(s) of the sacrificial gate structures, upon the STI region(s) 130 (not shown in the depicted cross sections), and around the one or more nanolayer stacks 120.

The BDI region(s) 142 and the gate spacer(s) 140 may be simultaneously formed by a conformal deposition of a dielectric material, such as silicon nitride, SiBCN, SiNC, SiN, SiCO, SiNOC, or a combination thereof, or the like, within the nanolayer cavity(ies), upon STI regions 130, upon around the one or more sacrificial gate structures, and upon and around the one or more nanolayer stack(s) 120. Subsequently, undesired portions of dielectric material may be removed while desired portions the dielectric material may be retained and thereby form the BDI region(s) 142 and the gate spacer(s) 140. The undesired portions of dielectric material may be removed by a directional ion etch, such as a reactive ion etch (RIE). The RIE may remove exposed or unprotected horizontal portions of the dielectric material while retaining protected horizontal portions of the dielectric layer (e.g., the BDI region(s) 142) and vertical portions of the dielectric layer (e.g., the gate spacer(s) 140).

Figure 16:
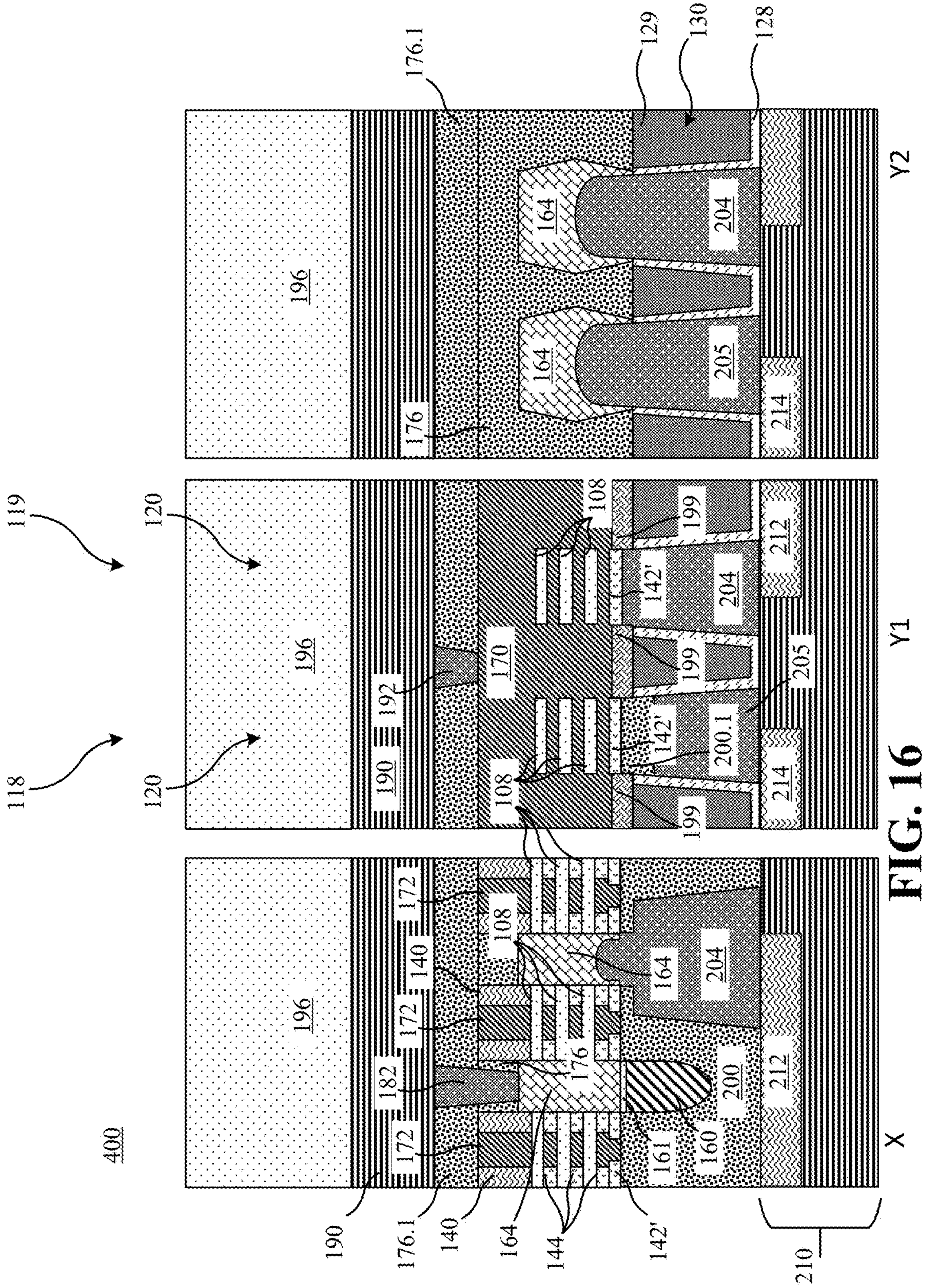
FIG. 16 depicts cross-section views of a semiconductor IC device that includes one or more BIE regions, according to one or more embodiments of the disclosure.

For clarity, other semiconductor IC devices, such as semiconductor IC device 400 depicted in FIG. 16, can be fabricated by operations that do not remove the bottom sacrificial nanolayer 104 to form the associated BDI cavity to allow the formation of both gate spacer(s) 140 and BDI regions 142. Rather, such semiconductor devices may retain the bottom sacrificial nanolayer 104 while the gate spacer(s) 140 are formed. This bottom sacrificial nanolayer 104 may be removed during the removal of the sacrificial nanolayers 106, and the bottom spacer isolator (BSI) 142' (as depicted in FIG. 16) may be formed along with the inner spacers 144.

Further in the depicted fabrication stages, source/drain (S/D) recesses 150 may be formed within the one or more nanolayer stacks 120 between gate spacers 140 of neighboring sacrificial gate structures. In other words, a single nanolayer stack 120 may be separated, by S/D recesses 150, into multiple nanolayer stacks 120 each located underneath at least a portion of respective sacrificial gate structures. Further in the depicted fabrication stages, sacrificial nanolayers 106 may be indented and a respective inner spacer 144 may be formed in each indent.

The one or more S/D recesses 150 may be formed between adjacent sacrificial gate structures by removing respective portions of the sacrificial nanolayers 106, active nanolayers 108, BDI region 142 that are between gate spacers 140 of adjacent or neighboring sacrificial gate structures. The one or more S/D recesses 150 may be formed to a depth to stop at the top surface of the substrate structure (e.g., the top surface of upper substrate 102, or the like), the top surface of STI regions 130, or the like. Alternatively, the one or more S/D recesses 150 may be formed to a depth within the upper substrate 102 above the etch stop layer 103 so that backside contact placeholder(s) 160 may be formed generally below a respective S/D region 164.

The undesired portions of sacrificial nanolayers 106, active nanolayers 108, and BDI region 142 may be removed by etching or other subtractive removal techniques. The top surface of the substrate structure may be used as an etch stop or other etch parameters may be controlled to stop the material removal at the substrate structure. As the gate spacers 140 and the sacrificial gate structures may be utilized to protect the underlying portions of sacrificial nanolayers 106, active nanolayers 108, and BDI region 142, respective sidewalls of the nanolayer stacks 120 may be substantially coplanar and substantially vertical with the outer sidewalls of the gate spacers 140 there above.

As used herein, "substantially vertical" sidewalls deviate from a direction normal to a major surface (e.g., top surface, etc.) of the substrate 102 by less than 5°, e.g., 0°, 1°, 2°, 3°, 4°, or 5°, including ranges between any of the foregoing values.

Further, horizontal or lateral indents may be formed by laterally or horizontally removing respective portions of sacrificial nanolayers 106 within the nanolayer stacks 120. The indents may be formed by a reactive ion etch (RIE) process, which can remove portions of the sacrificial nanolayers 106. The horizontal depth of the indents may be chosen to set a length for a replacement gate structure 170 that is formed in place of one sacrificial gate structure. When the sacrificial nanolayers 106 are composed of SiGe and when active nanolayers 108 are Si, the directional RIE can use a boron-based chemistry or a chlorine-based chemistry, for example, which recesses or removes the exposed end portions of sacrificial nanolayers 106 (e.g., end portions of sacrificial nanolayers 106 generally below spacer 140) selective to the Si active nanolayers 108. In alternative implementations when sacrificial nanolayers 106 are not SiGe and when active nanolayers 108 are not Si, the directional etch of the sacrificial nanolayers 106 may generally be selective to the active nanolayers 108, gate spacers 140, STI regions 130, and/or substrate structure.

Further in the depicted fabrication stages, a respective inner spacer 144 is formed within each indent. The one or more inner spacers 144 can be formed by ALD or CVD or any other suitable deposition technique that deposits a dielectric material within the indent(s), thereby forming the inner spacer(s) 144. In some examples, the inner spacer(s) 144 are composed of a low-K dielectric material (a material with a lower dielectric constant relative to $SiO_2$), SiN, SiO, SiBCN, SiOCN, SiCO, etc. or any other suitable dielectric material. In certain implementations, after the formation of the inner spacer(s) 144, an isotropic etch process is performed to create substantially vertical sidewalls of the inner spacer(s) 144 that are coplanar with the substantially vertical sidewalls of the active nanolayers 108, of the gate spacers 140, and/or of the BDI region 142.

Further in the depicted fabrication stages, one or more backside contact placeholders 160 are formed within the substrate structure in between adjacent sacrificial gate structures within a respective S/D recess 150. In one example, the one or more backside contact placeholders 160 may be formed only in locations in which a backside contact, such as backside contact 204 depicted in FIG. 13, or the like, is to be formed. In an alternative example, a respective backside contact placeholder 160 may be formed in location(s) in which a backside contact is to be formed and in location(s) where a backside contact is not to be formed.

If the S/D recesses 150 are not of sufficient depth, the one or more backside contact placeholders 160 may be formed by initially forming one or more backside contact placeholder cavities within the substrate structure generally in between adjacent sacrificial gate structures and underneath respective one or more S/D recesses 150. For example, the one or more backside contact placeholder(s) cavities may be formed by a subtractive removal technique, such as an etch, that removes associated portion(s) of the upper substrate 102. The etch may be timed or otherwise controlled to stop the removal of the upper substrate 102 such that the depth or bottom of the one or more backside contact placeholder(s) cavities are above the etch stop layer 103.

The one or more backside contact placeholders 160 may be further formed by epitaxially growing an epitaxial material from exposed substrate structure surface(s) within the one or more backside contact placeholder(s) cavities. In some embodiments, epitaxial growth and/or deposition processes may be selective to forming on the semiconductor surfaces of the upper substrate 102, and may not deposit material on dielectric surfaces, such as silicon dioxide or silicon nitride surfaces. In some embodiments, the epitaxial growth of the one or more backside contact placeholders 160 may overgrow above the top surface of the substrate structure or above the top surface of BDI region(s) 142. In an example, the epitaxial material of the one or more backside contact placeholders 160 may be chosen to be etch selective to the material of the S/D region(s) 164, the material of the upper substrate 102, or the like. In another example, an etch stop layer 161 (e.g., a Si epitaxially grown layer, or the like) may be formed upon the top surface of the backside contact placeholders 160. For example, the one or more backside contact placeholders 160 may be SiGe and a Si etch stop layer 161 may be epitaxially grown from the top surface of the SiGe backside contact placeholders 160. Respective top surfaces of the backside contact placeholders 160 (or etch stop layer 161 thereupon) may be substantially horizontal and below the bottom surface of the bottommost active nanolayer 108 (e.g., to enable contact between such active nanolayer 108 and the S/D region 164) and/or substantially coplanar with a respective one or more top surface(s) of BDI region(s) 142.

Further in the depicted fabrication stages, a respective S/D region 164 is formed upon a backside contact placeholder 160. The S/D region 164 forms either a source or a drain, respectively, of respective transistor, such as a GAA FET, and is connected to respective a side or end surface of the active nanolayers 108 of a nanolayer stack 120. The S/D region 164 is composed of a semiconductor material and a dopant. As used herein, a "source/drain" region can be a source region or a drain region depending on subsequent wiring and application of voltages during operation of the transistor. The semiconductor material that provides each of the S/D region 164 is composed of one of the semiconductor materials mentioned above for the semiconductor structure. The semiconductor material that provides the S/D region 164 can be compositionally the same, or compositionally different from each active nanolayer 108. The dopant that is present in the S/D region 164 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the S/D region 164 can have a dopant concentration of from $4\times10^{20}$ atoms/$cm^3$ to $3\times10^{21}$ atoms/$cm^3$.

The one or more S/D regions 164 may be epitaxially grown or formed. In some examples, the S/D region 164 are formed by in-situ doped epitaxial growth. The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, the S/D epitaxial growth conditions that promote in-situ Boron doped SiGe for p-type transistor and phosphorus or arsenic doped silicon or Si:C for n-type transistors.

In some examples, the epitaxial growth that forms the one or more S/D region 164 occurs or is promoted from the top surface of upper substrate 102, from the upper surface of backside contact placeholders 160 (or etch stop layer 161 thereupon), while epitaxial growth is limited or does not occur from neighboring STI regions 130.

In some embodiments, epitaxial growth to form the one or more bottom S/D regions 164 may overgrow above the upper surface of the sacrificial gate structure(s) and be subsequently recessed such that the top surface of the S/D region 164 may be substantially horizontal and above the top surface of the topmost active nanolayer 108 within the nanolayer stacks 120 (e.g., to enable contact between such active nanolayer 108 and the S/D region 164).

Further in the depicted fabrication stages, an interlayer dielectric (ILD) 176 may be formed. For example, a blanket ILD 176 may be deposited over the S/D region(s) 164, over the STI region(s) 130, over the sacrificial gate structures, and over the gate spacers 140 associated with adjacent sacrificial gate structures.

The ILD 176 can be any suitable material, such as, for example, porous silicates, carbon doped oxides, silicon dioxides, silicon nitrides, silicon oxynitrides, OPL, or other dielectric materials. Any known manner of forming the ILD 176 can be utilized. The ILD 176 can be formed using, for example, CVD, PECVD, ALD, flowable CVD, spin-on dielectrics, or PVD.

In an example, the ILD 176 may be formed to a thickness above the top surface of the sacrificial gate structures. Subsequently, a planarization process, such as a CMP, may be performed to remove excess ILD 176 material and to remove the sacrificial gate caps of the sacrificial gate structures, thereby exposing the sacrificial gate thereunder. The planarization may also partially remove some of the sacrificial gates or may at least expose the sacrificial gate of the sacrificial gate structures. The CMP may create a substantially planar or substantially horizontal top surface for the semiconductor IC device 100. In other words, the respective top surfaces of ILD 176, gate spacers 140, sacrificial gates, etc. may be substantially coplanar and/or substantially horizontal.

Further in the depicted fabrication stages, the sacrificial gate structures are removed and replacement gate structures 170 may be formed in place thereof. The sacrificial gate structures may be removed by initially removing the sacrificial gate and sacrificial gate oxide by a removal technique, such as one or more series of etches. For example, such removal may be accomplished by a wet chemical etching process in which one or more chemical etchants are used to remove the sacrificial gate and sacrificial gate oxide of the sacrificial gate structures. Appropriate etchants may be used that remove the sacrificial gate and/or sacrificial gate oxide selective to the active nanolayers 108, inner spacers 144, gate spacers 140, BDI region 142, STI regions 130, or the like. For clarity, the removal of the sacrificial gate structure may further remove the sacrificial gate, sacrificial gate oxide, or the like.

Next, the active nanolayers 108 may be released by removing the sacrificial nanolayers 106. The sacrificial nanolayers 106 may be removed by a removal technique, such as one or more series of etches. For example, the etching can include a wet chemical etching process in which one or more chemical etchants are used to remove the sacrificial nanolayers 106. Appropriate etchants may be used that remove the sacrificial nanolayers 106 selective to the active nanolayers 108, inner spacers 144, BDI region 142, gate spacers 140, or the like. After the removal of sacrificial nanolayers 106, void spaces may be formed above and/or below the active nanolayers 108.

Further, in the depicted fabrication stages, a replacement gate structure 170 is formed in place of the removed sacrificial gate structures around the active nanolayers 108, upon STI region(s) 130, upon BDI region(s) 142, and within the gate extension opening(s) 123.

Replacement gate structure(s) 170 may be formed by initially forming an interfacial layer (not shown) on the gate spacers 140, on the active nanolayers 108, on the BDI region 142, on the inner spacers 144, and within the gate extension opening(s) 123, etc. that are interior to and/or upon the respective surfaces interior to the opening created by the removal of the sacrificial gate structure and the releasing of the active nanolayers 108. The interfacial layer can be deposited by any suitable techniques, such as ALD, CVD, PVD, thermal oxidation, combinations thereof, or other suitable techniques.

Replacement gate structure(s) 170 may be further formed by forming a high-k layer (not shown) to cover the exposed surfaces of the interfacial layer. The high-κ layer can be deposited by any suitable techniques, such as ALD, CVD, metal-organic CVD (MOCVD), PVD, thermal oxidation, combinations thereof, or other suitable techniques. A high-κ material is a material with a higher dielectric constant than that of $SiO_2$, and can include e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-layer can include a single layer or multiple layers, such as metal layer, liner layer, wetting layer, and adhesion layer. In other embodiments, the high-κ layer can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure(s) 170 may be further formed by depositing a work function (WF) gate (not shown) upon the high-k layer. The WF gate can be comprised of a conductor or metal, such as, e.g., copper (Cu), cobalt (Co), aluminum (Al), platinum (Pt), gold (Au), tungsten (W), titanium (Ti), nitride ($N^{3-}$) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the WF gate sets the threshold voltage (Vt) of the device. The high-κ layer may separate the WF gate from the nanolayer channel (i.e., active nanolayer 108). Other metals that may be desired to further fine tune the effective work function (eWF) and/or to achieve a desired resistance value associated with current flow through the gate in the direction parallel to the plane of the nanolayer channel.

The one or more replacement gate structure(s) 170 may be further formed by depositing a conductive fill gate 172. In an example, when none of the previous replacement gate material(s) are utilized in the replacement gate structures 170, the conductive fill gate 172 may be formed upon the same or similar surfaces as those upon which the interfacial layer, described above, may be formed. In other examples, when one or more of the interfacial layer, the high-κ layer, the WF gate, or the like, are utilized in the replacement gate structures, the conductive fill gate 172 may be formed upon the most recent formation thereof.

The conductive fill gate 172 can be comprised of a conductor material and/or metal, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 170 formation, the top surface of the semiconductor IC device 100 may be planarized by a planarization technique such as a CMP, mechanical grinding process, or the like. After the planarization technique, respective top surfaces of the ILD 176, gate spacers 140, replacement gate structure(s) 170, may be substantially horizontal and/or may be substantially coplanar.

Figure 5:
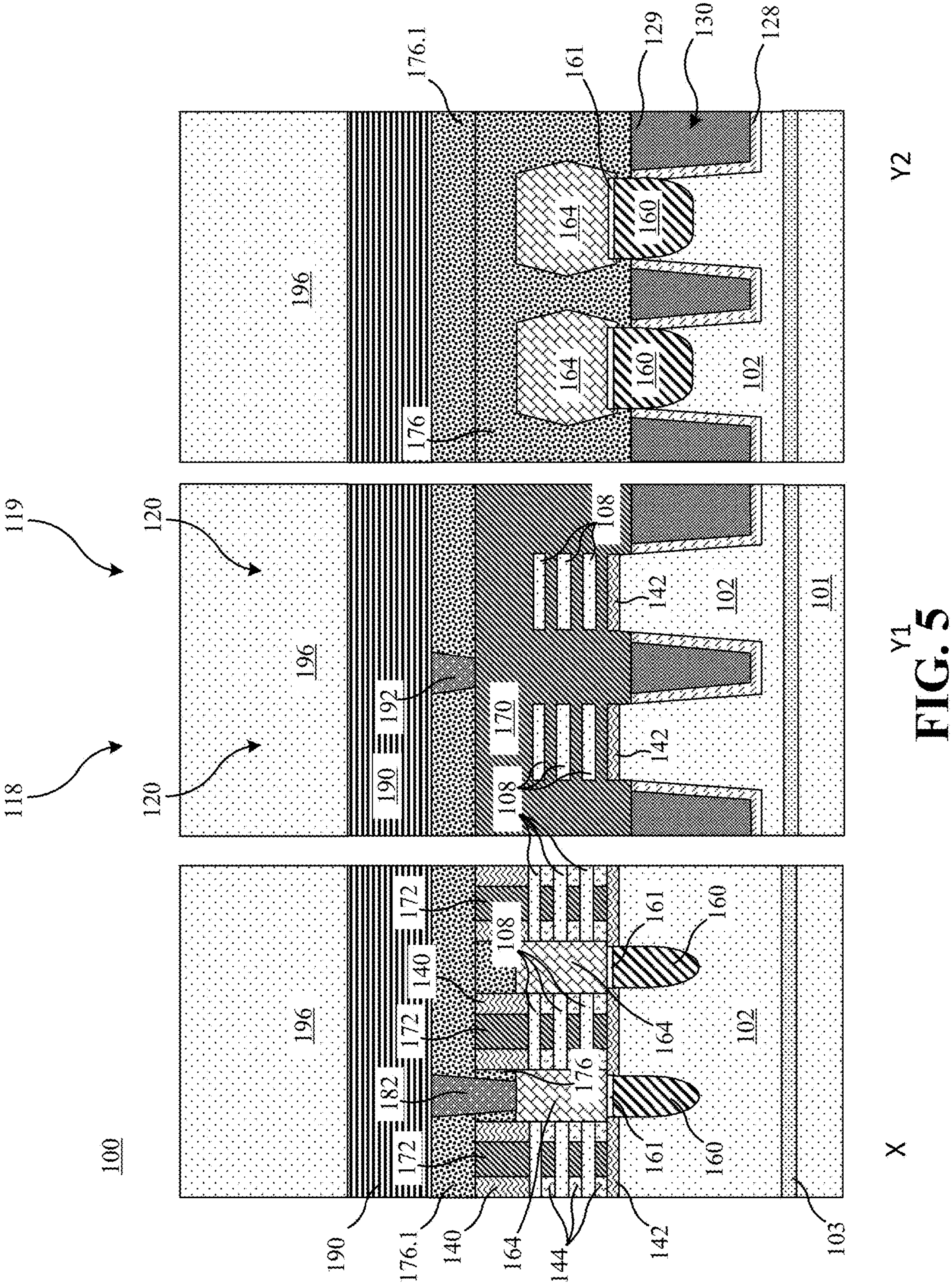

FIG. 5 depicts cross-sectional views of the semiconductor IC device 100 after fabrication operations, in accordance with embodiments of the present disclosure. In the depicted fabrication stages, ILD 176.1 may be formed, one or more frontside contact(s) 182, 192 may be formed, a frontside BEOL network 190 may be formed, and a carrier wafer 196 may be attached.

The ILD 176.1 may be formed upon respective top surfaces of replacement gate structure(s) 170, ILD 176, and gate spacers 140. The ILD 176.1 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 176.1 can be utilized. The ILD 176.1 can be formed using, for example, CVD, PECVD, ALD, flowable CVD, spin-on dielectrics, or PVD.

The frontside contact(s) 182, 192 may be formed by patterning respective frontside contact openings within ILD 176.1 and/or ILD 176, respectively, from the frontside (i.e., from above the semiconductor IC device 100, as depicted, downward to respective structures thereof). The frontside contact(s) 182, 192 may be in direct or indirect physical and electrical contact and/or may physically meld with respective material(s) of one or more regions of the semiconductor IC device 100. For example, the illustrated frontside contact 182 is in direct contact with S/D region 164 and the illustrated frontside contact 192 is in direct contact with replacement gate structure 170.

The frontside contact(s) 182, 192 may be formed by initially forming frontside contact opening(s). The frontside contact opening(s) may be formed by the same or shared lithography and etch process(es) or by sequential lithography and etch processes. In such process(es), a mask may be applied and patterned. An opening in the patterned mask may expose the portion of the underlying ILD 176.1 and/or ILD 176 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention.

The frontside contact(s) 182, 192 may be further formed by depositing conductive material such as metal into the respective frontside contact opening(s). In an example, frontside contact(s) 182, 192 may be formed by depositing a liner, such as Ni, NiPt or Ti, etc. into the contact opening(s), depositing an adhesion liner, such as TiN, TaN, etc. upon the liner, and by depositing a conductive fill, such as Al, Ru, W, Co, Cu, etc. upon the metal adhesion liner. Subsequently, a planarization process, such as a CMP process or a mechanical grinding process, may remove excess portions of the liner, the metal adhesion liner, conductive fill. Subsequently, the respective top surfaces of frontside contact(s) 182, 192 and ILD 176.1 may be substantially horizontal and/or substantially coplanar. In embodiments, the frontside contact(s) 182, 192 are fabricated in middle-of-line (MOL) fabrication operations and may be illustrations of MOL frontside contacts.

In the semiconductor IC device fabrication industry, there are three sections referred to in a build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

Figure 14:
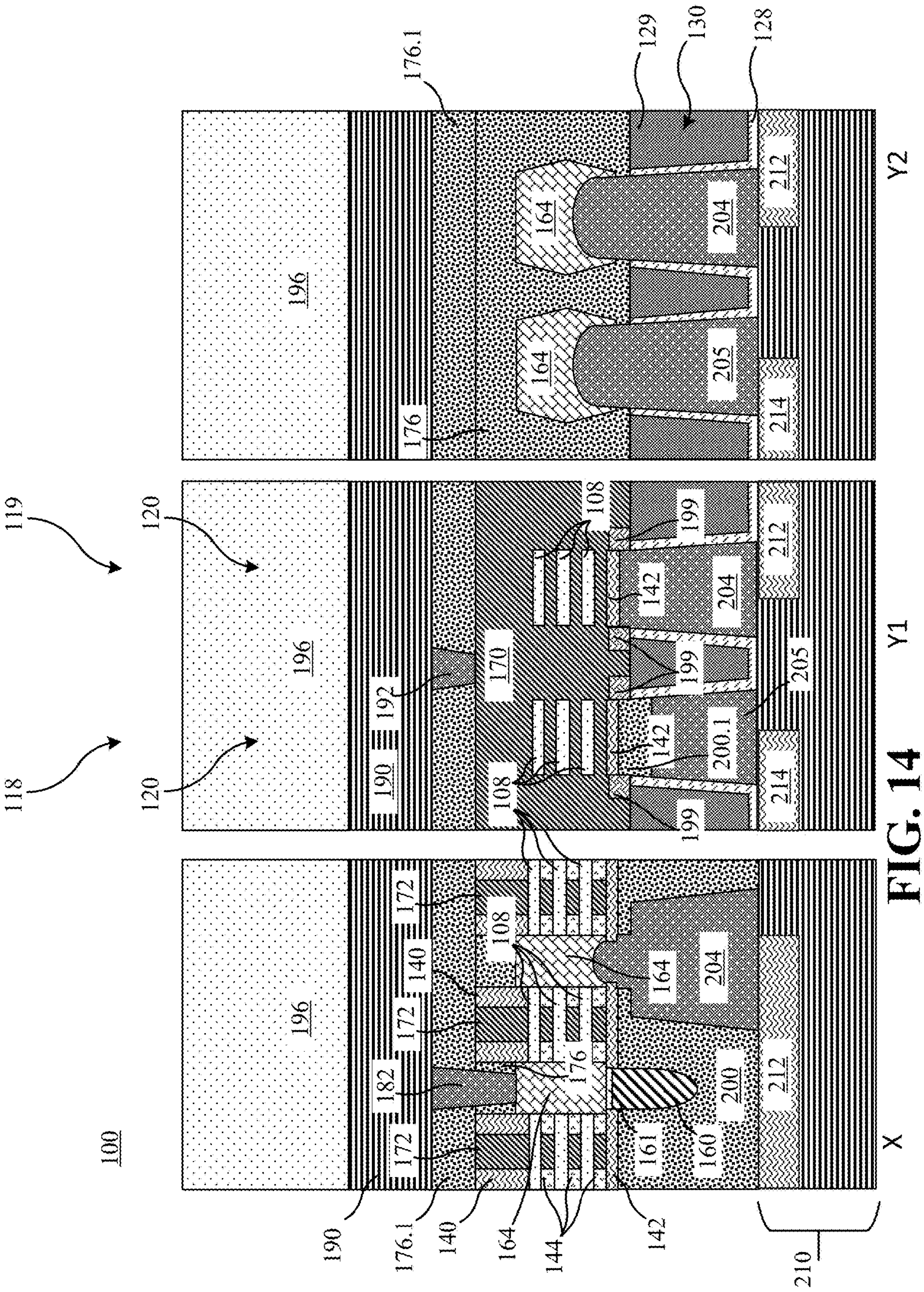

BEOL is the second portion of IC fabrication where the individual devices (e.g., transistors, capacitors, resistors, etc.) become interconnected with wiring on the semiconductor IC device, e.g., the metallization layer or layers of a wafer. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than one metal layers may be added in the BEOL. In the present example, there are multiple BEOL levels each on opposites sides of the semiconductor IC device 100. First, a frontside BEOL network 190 is formed on the frontside of the semiconductor device 100. Subsequently, a backside BEOL network 210, as depicted in FIG. 14 is formed.

In the depicted example, the frontside BEOL network 190 is formed over the ILD 176.1 and upon the frontside contact(s) 182, 192. Respective wires within the frontside BEOL network 190 may be electrically connected to the one or more S/D regions 164, one or more replacement gate structure(s) 170, or the like, by a respective frontside contact(s) 182, 192. For example, respective wire(s) within the frontside BEOL network 190 may be electrically connected to the S/D region 164 by frontside contact 182, and another and different group of respective wire(s) within the frontside BEOL network 190 may be electrically connected to the replacement gate structure 170. Alternatively, respective wires within the frontside BEOL network 190 may be electrically connected to the one or more S/D regions 164, one or more replacement gate structure(s) 170, or the like, by a lowest interconnect, such as a vertical interconnect access (VIA), that is within the frontside BEOL network 190.

The frontside BEOL network 190 is located directly on the frontside surface of the MOL structure (e.g., ILD 176.1, frontside contact(s) 182, 192 etc.). The frontside BEOL network 190 can include one or more interconnect dielectric material layers (including one of the dielectric materials mentioned above for the frontside ILD 176) and contains frontside metal wires (the metal wires can be composed of any electrically conductive metal or electrically conductive metal alloy) embedded therein. In some embodiments, the frontside metal wires within the frontside BEOL network 190 are composed of Cu. The frontside BEOL network 190 can include "x" numbers of frontside metal levels, wherein "x" is an integer starting from 1. The frontside BEOL network 190 may further contain conductive pads that are connected to one or more of the metal wires and may be used to connect the semiconductor IC device to an external and/or higher-level structure, such as a chip carrier, motherboard, or the like.

The carrier wafer 196 can include one of the semiconductor materials mentioned above for the semiconductor structure. Carrier wafer 196 may be attached to the semiconductor IC device 100 by a wafer-to-wafer bonding technique.

Figure 6:
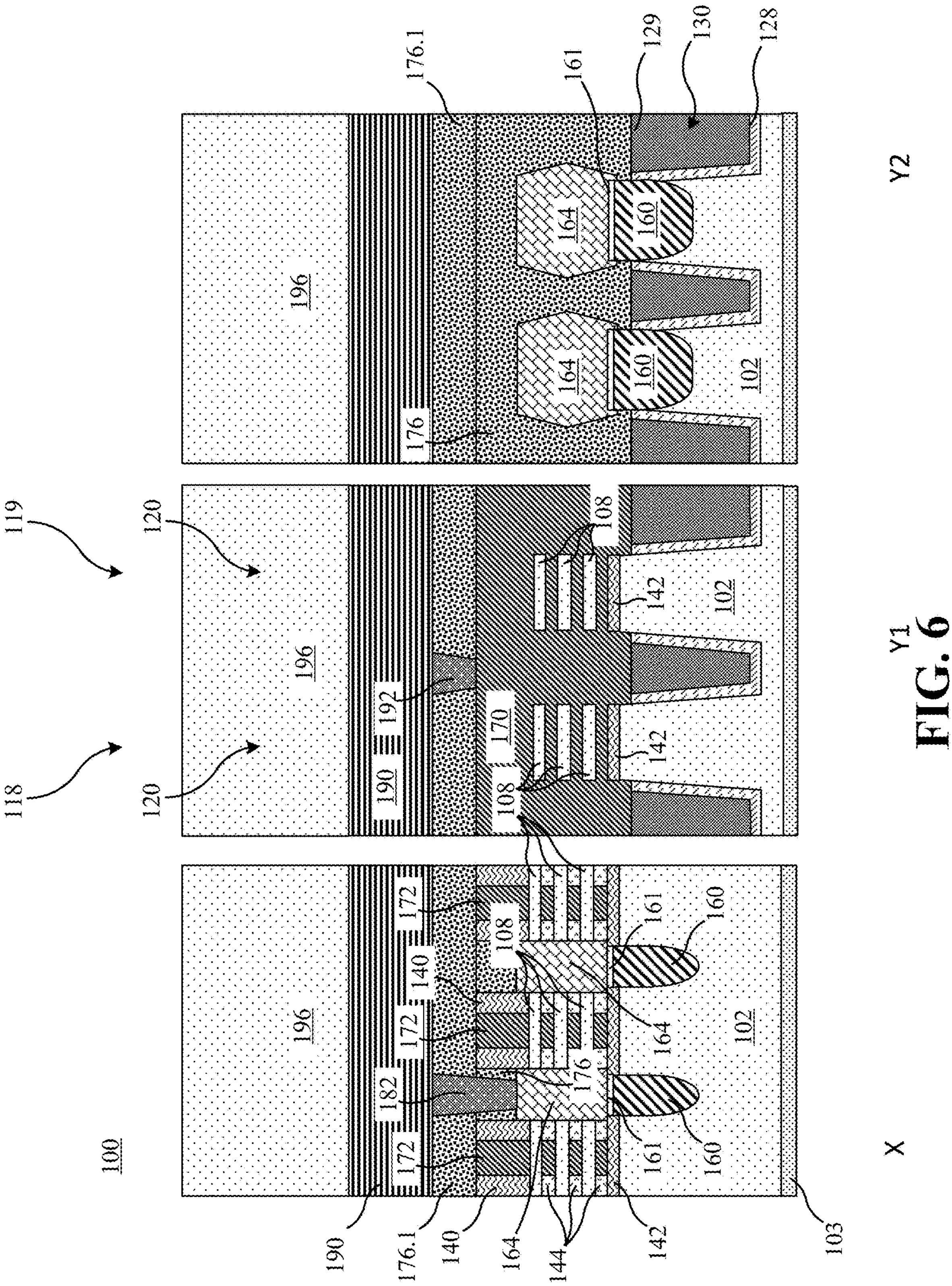

FIG. 6 depicts cross-sectional views of the semiconductor IC device 100 after fabrication operations, in accordance with embodiments of the present disclosure. In the depicted fabrication stages, the substrate structure may be recessed. For example, the lower substrate 101 may be removed.

The substrate structure may be recessed by flipping the semiconductor IC device 100 (not shown) and removing the lower substrate 101 using any removal technique, such as a combination of wafer grinding, CMP, dry, and/or wet etch. In the example depicted, lower substrate 101 is removed by an etch that utilizes etch stop layer 103 as the etch stop. In this example, removal of lower substrate 101 exposes the bottom surface of etch stop layer 103.

Figure 7:
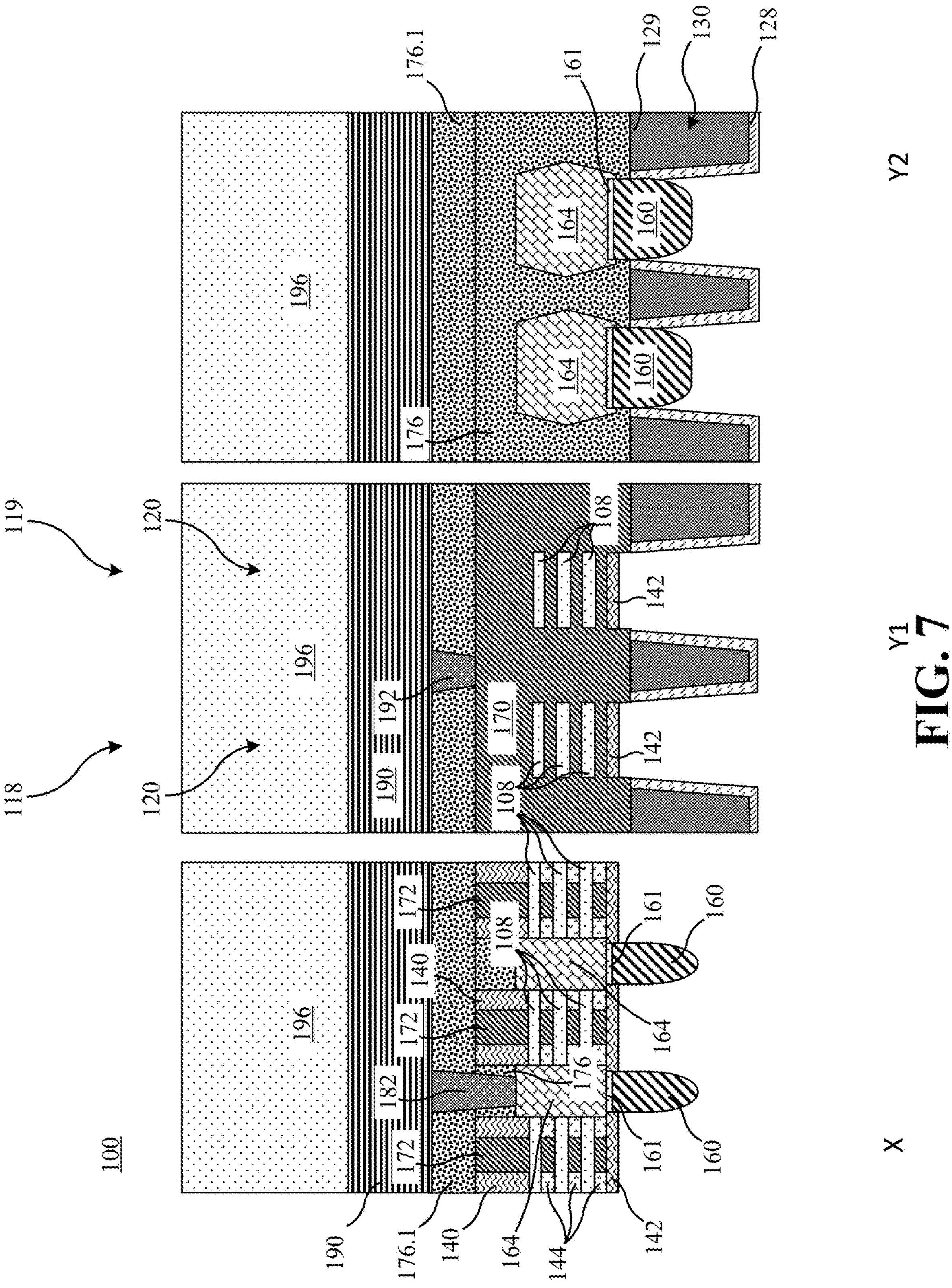

FIG. 7 depicts cross-sectional views of the semiconductor IC device 100 after fabrication operations, in accordance with embodiments of the present disclosure. In the depicted fabrication stages, the remaining substrate structure may be removed. For example, etch stop layer 103 and the upper substrate 102 may be removed.

The etch stop layer 103 may be removed by a subtractive removal technique such as a CMP, dry and/or wet etch. Upon removal of the etch stop layer 103, the bottom surface upper substrate 102 is exposed. The removal of etch stop layer 103 may be selective to the material of upper substrate 102. For example, etch stop layer 103 is removed by an etch that utilizes upper substrate 102 as the etch stop.

Subsequently, the upper substrate 102 is removed by an appropriate substrative removal technique, such as an etch, that removes associated portion(s) of the upper substrate 102. The etch may be timed or otherwise controlled to remove the material of substrate 102 and retain or otherwise expose the STI regions 130, retain and partially expose one or more backside contact placeholders 160, retain and expose the BDI region(s) 142, and retain and expose portion(s) of the replacement gate structure 170 that are below the BDI region(s) 142 and that may be substantially coplanar and/or substantially parallel with the sidewalls of the STI region(s) 130 there below.

Figure 8:
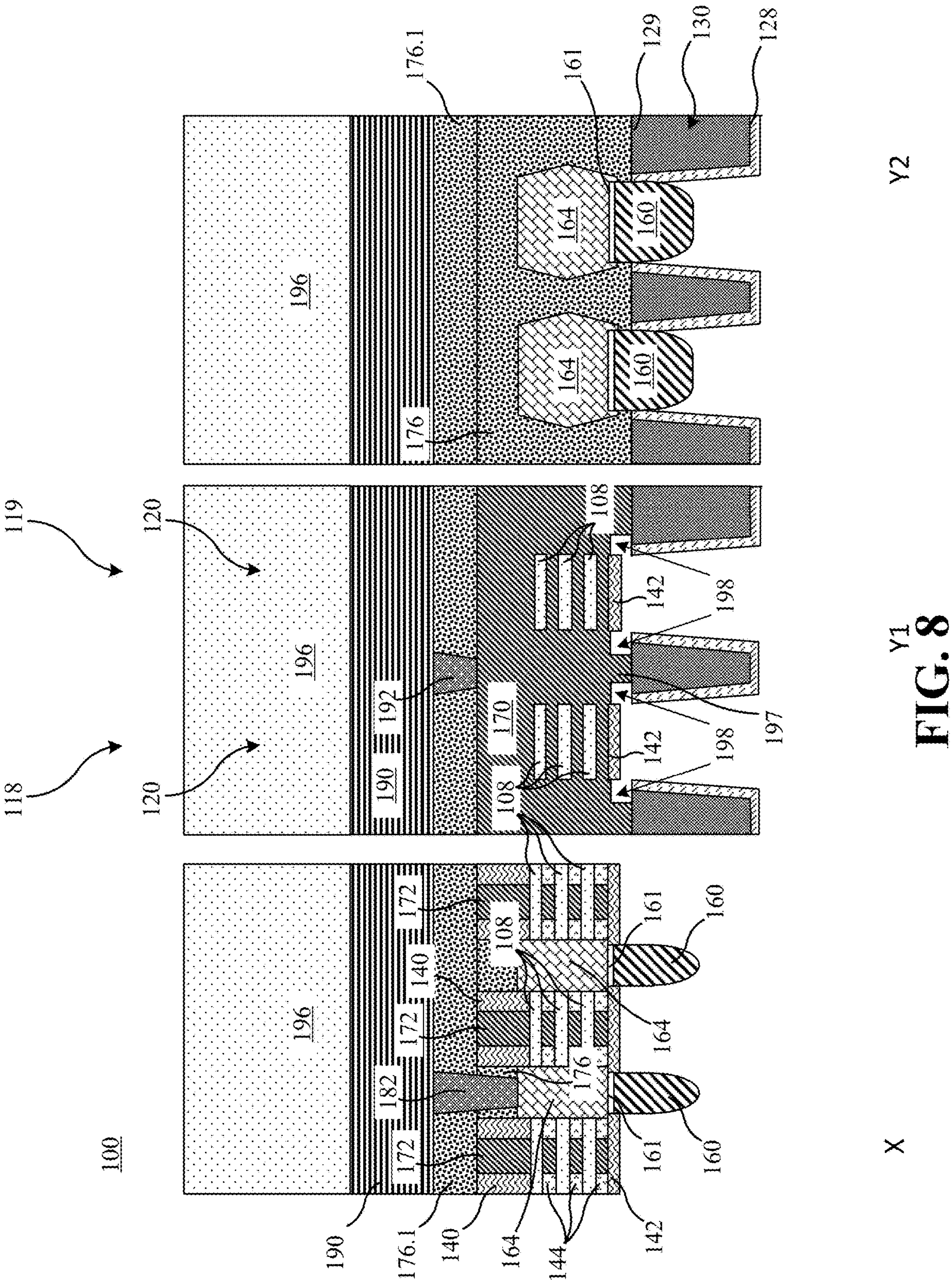

FIG. 8 depicts cross-sectional views of semiconductor IC device 100 shown after exemplary fabrication operation(s), in accordance with one or more embodiments. In the depicted fabrication stage, BIE region openings 198 are formed within the replacement gate structure(s) 170.

The BIE region openings 198 may be formed by a horizontal or lateral indentation etch or other selective removal of the applicable replacement gate structure 170 material(s) that are exposed (e.g., those portions the replacement gate structure 170 that are below the BDI region(s) 142 and that may be substantially coplanar and/or substantially parallel with the sidewalls of the STI region(s) 130 there below) by the removal of the substrate structure. For example, the BIE region openings 198 may be formed by laterally or horizontally removing respective portions of interfacial layer, high-κ layer, WF gate, and/or conductive fill gate 172 of the replacement gate structure 170. As the BIE region openings 198 are formed within the replacement gate structure 170, the BIE region openings 198 may be in line with that replacement gate structure 170. For example, with reference to cross-section Y1, respective front and/or rear boundaries of the one or more of the BIE region openings 198 may be defined by the gate spacer 140 that is around the associated sacrificial gate structure 170.

The BIE region openings 198 may be formed by a reactive ion etch (RIE) process, which can remove portions of the replacement gate structure 170 selective to the BDI region(s) 142, the STI region(s) 130, or the like. The horizontal depth of the indents may be chosen to set maintain a portion 197 of the replacement gate structure 170 between transistors, as depicted. In some implementations the portion 197 may be associated or integral with a backside gate extension region to allow a backside contact to directly connect with the replacement gate structure 170. Alternatively, the horizontal depth of the indents may be chosen to remove such portion 197 of the replacement gate structure 170 by allowing the BIE region openings 198 associated with neighboring transistors to merge. This geometry of merged BIE region openings 198 may effectively remove an entire lower portion of the replacement gate structure 170 and may improve parasitic capacitances between the replacement gate structure 170 and the other structures within the semiconductor IC device 100, since the volume of conductive material within replacement gate structure 170 is decreased.

Figure 13:
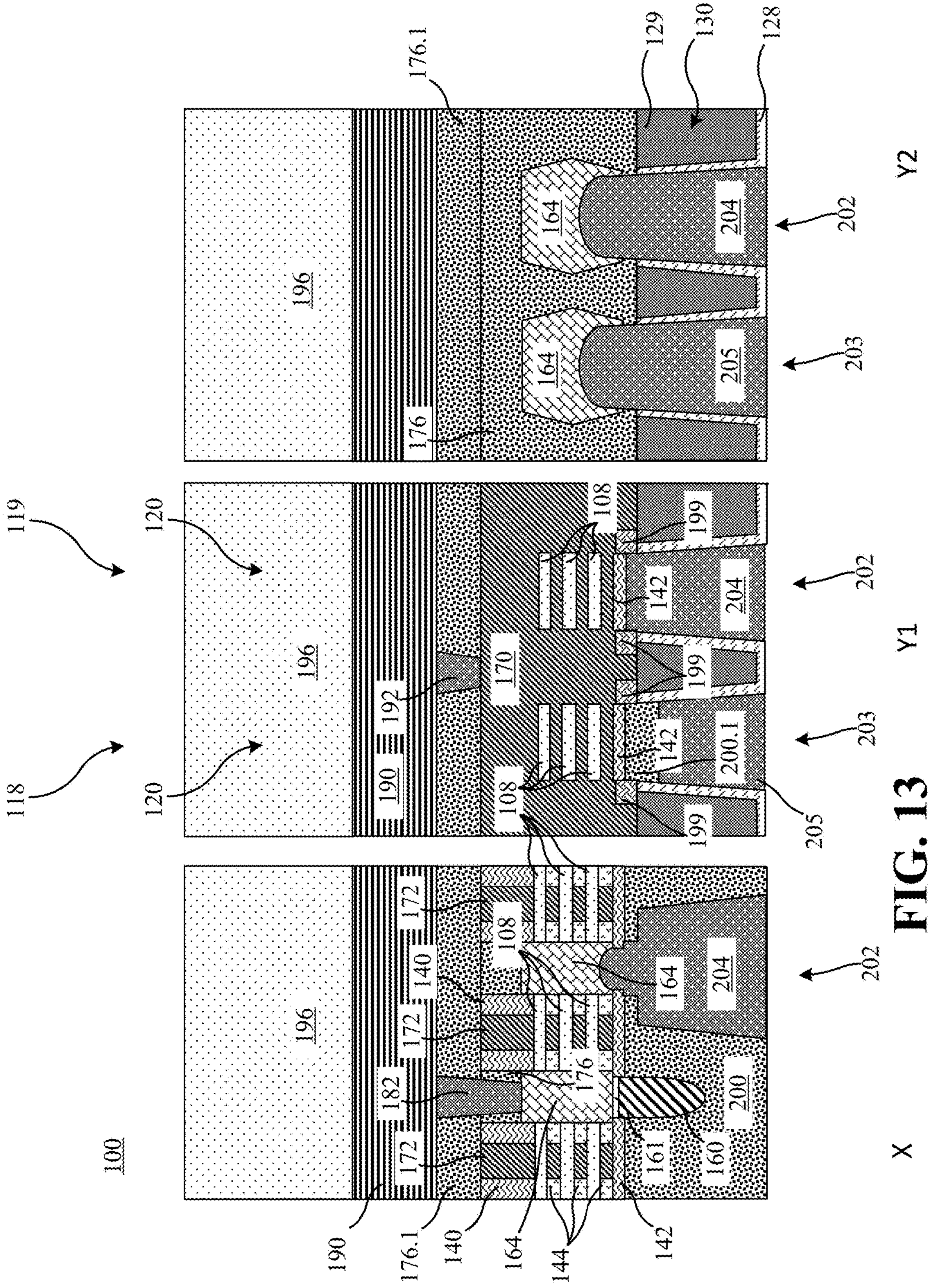

The vertical depth of the indents may be chosen so that a top surface of one or more of the BIE region openings 198 is at least substantially coplanar with or below the top surface of the BDI region(s) 142 and also generally above the bottom surface of the BDI region(s) 142, as depicted. This geometry may be advantageous to ensure adequate conductive material of the replacement gate structure 170 is present below the bottommost of the active semiconductor nanolayer 108 while also ensuring an exposed corner of the BDI region(s) 142 that results in adequate isolation material formed within the BIE region openings 198 to isolate the replacement gate structure 170 from the backside contact, such as backside contacts 204, 205 as depicted in FIG. 13.

Alternatively, the vertical depth of the indents may be chosen so that a top surface of one or more of the BIE region openings 198 is below the bottom surface of the bottommost active semiconductor nanolayer 108. This geometry may be advantageous to ensure adequate conductive material of the replacement gate structure 170 is present below the bottom most of the active semiconductor nanolayer 108 while also increasing or maximizing the isolation material formed within the BIE region openings 198 to further isolate the replacement gate structure 170 from the backside contact.

Figure 9:
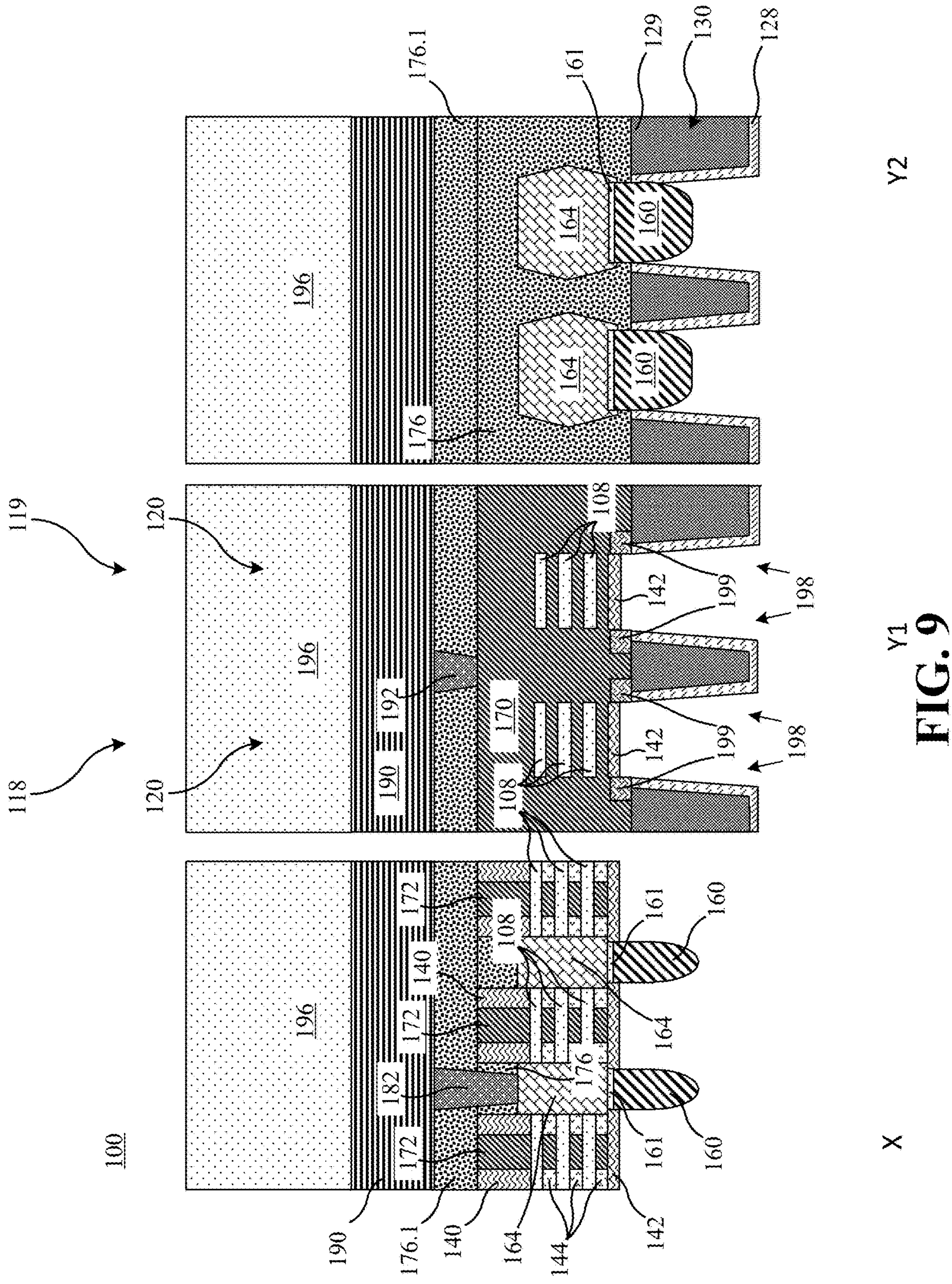

FIG. 9 depicts cross-sectional views of semiconductor IC device 100 shown after exemplary fabrication operation(s), in accordance with one or more embodiments. In the depicted fabrication stage, a BIE region 199 may be formed within the one or more BIE region openings 198.

The one or more BIE region(s) 199 may be formed by depositing a dielectric material within the one or more BIE region openings 198. The one or more BIE region(s) 199 can be formed by ALD or CVD or any other suitable deposition technique that deposits a dielectric material within the one or more BIE region openings 198, thereby forming the one or more BIE region(s) 199. In some examples, one or more BIE region(s) 199 are composed of a low-κ dielectric material, SiN, SiO, SiBCN, SiOCN, SiCO, etc. or any other suitable dielectric material.

In certain implementations, the deposition of the dielectric material is controlled to merely fill up to the volume and within the one or more BIE region openings 198. In other implementations, the dielectric material is deposited as a blanket layer and subsequently etched back to remove excess dielectric material while retaining the dielectric material that is within the one or more BIE region openings 198. In some implementations, the dielectric material may further be retained upon the bottom surface of the BDI region(s) 142 and may effectively join the otherwise disparate BIE region(s) 199 on either side of the BDI region(s) 142.

In some implementations, the dielectric material of the one or more BIE region(s) 199 may be the same material as either one or both of the BDI region(s) 142 or the inner spacers 144. This may allow for fabrication process tooling consistency, efficiency, or the like. In other implementations, the dielectric material of the one or more BIE region(s) 199 may be a relatively different material as the BDI region(s) 142, the inner spacers 144, or the like. For example, the material of the BIE region(s) 199 may be selected to achieve an adequate or predetermined electrical isolation between the gate structure and the backside contact. Such degree of electrical isolation may require the BIE region(s) 199 be formed of a different material relative to either one or both of the BDI region(s) 142 or the inner spacers 144.

Figure 10:
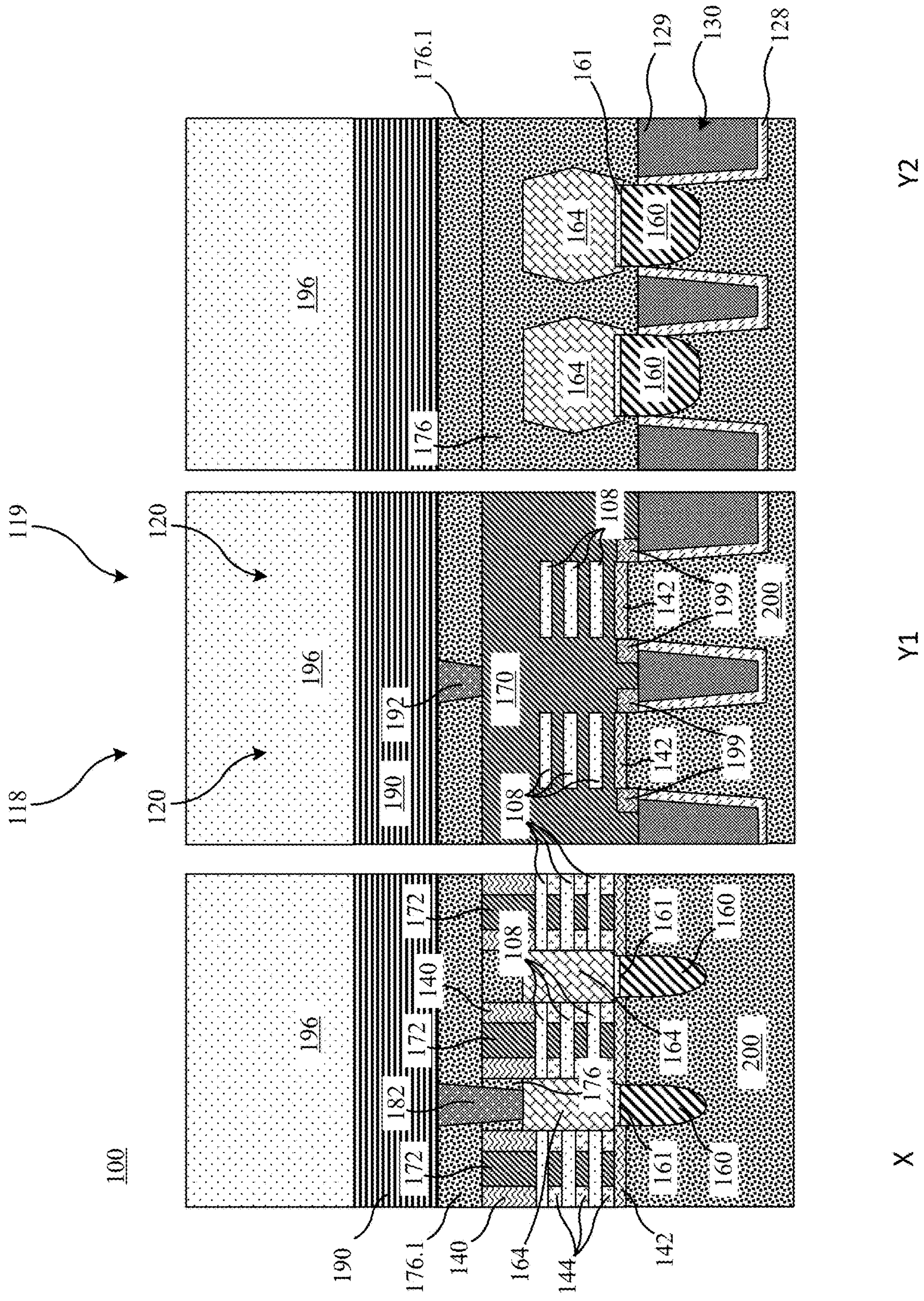

FIG. 10 depicts cross-sectional views of semiconductor IC device 100 shown after exemplary fabrication operation(s), in accordance with one or more embodiments. In the depicted fabrication stage, backside ILD 200 may be formed upon the exposed backside of the semiconductor IC device 100.

The backside ILD 200 may be formed upon the respective exposed backside surfaces of the STI regions 131, the backside contact placeholder(s) 160, the BIE region(s) 199, and/or the BDI region(s) 142. The backside ILD 200 may be formed by depositing a dielectric material, such as, for example, porous silicates, carbon doped oxides, silicon dioxides, silicon nitrides, silicon oxynitrides, or other dielectric materials. Any appropriate deposition technique for forming the backside ILD 200 can be utilized. The backside ILD 200 can be formed using, for example, CVD, PECVD, ALD, flowable CVD, spin-on dielectrics, or PVD. In an example, the backside ILD 200 may be formed to a thickness below (as depicted) the bottom surface of the STI regions. Subsequent to the deposition of the ILD 200, a planarization process, such as a CMP may planarize the backside surface of the semiconductor IC device.

Figure 11:
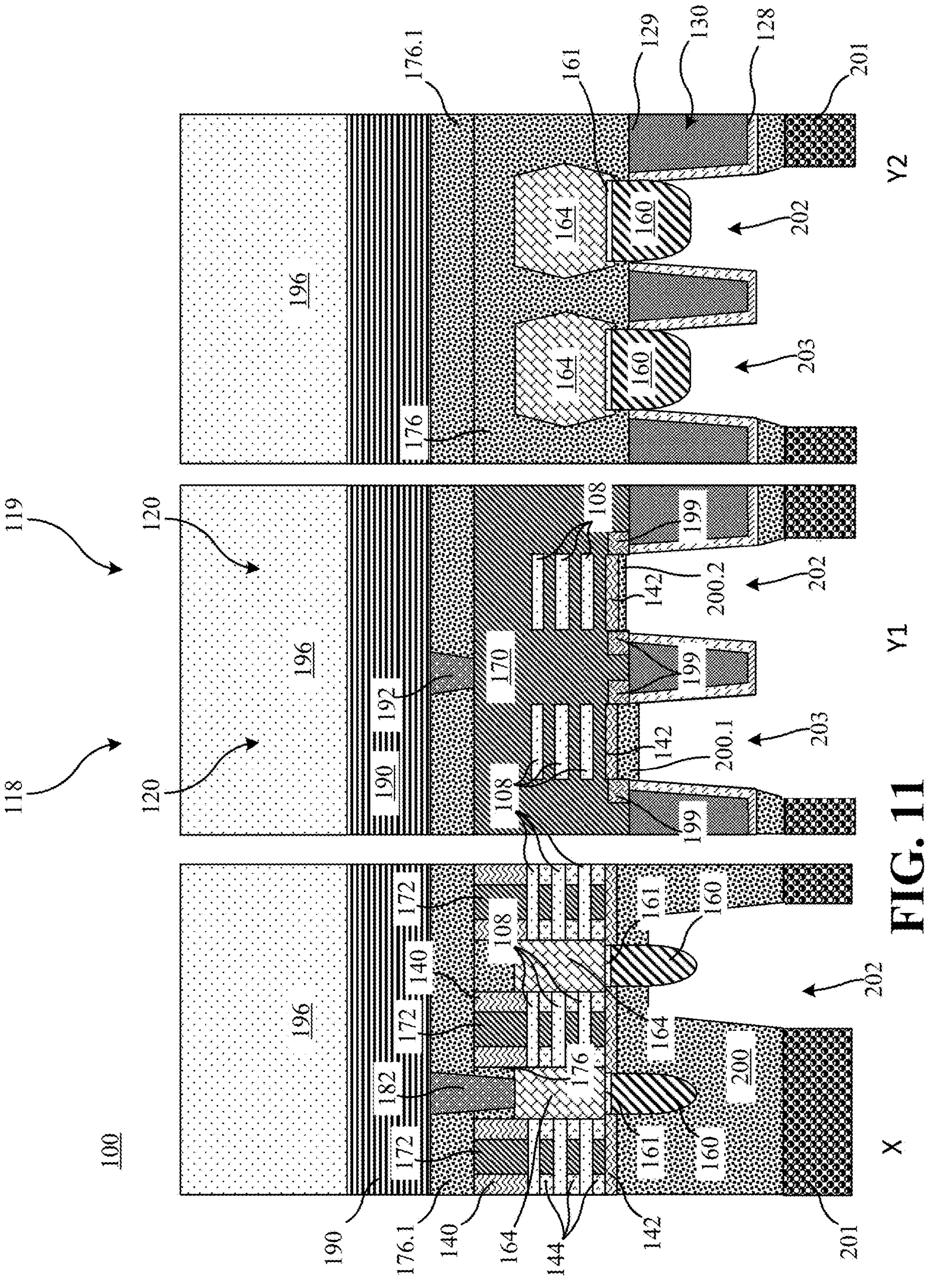

FIG. 11 depicts cross-sectional views of semiconductor IC device 100 shown after exemplary fabrication operation(s), in accordance with one or more embodiments. In the depicted fabrication stage, backside contact opening(s) 202, 203 may be formed within backside ILD 200.

The backside contact opening(s) 202, 203 may be formed by the same or shared lithography and etch process(es), or sequential lithography and etch processes. In such process(es), a mask 201 may be applied to the backside of the backside ILD 200 and patterned. Openings in the patterned mask may expose the portion of the underlying backside ILD 200 to be removed while other protected portions of semiconductor IC device 100 may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention.

In the depicted example, the backside contact opening 202 and the backside contact opening 203 is formed within backside ILD 200. The backside contact opening 202 exposes the and/or partially removes a portion of the backside contact placeholder 160 there above (as depicted in the Y2 cross-sectional view) and may expose or nearly expose (such that subsequent fabrication operations expose) the BDI region 142 there above (e.g., a relatively small amount of backside ILD 200.2 may be retained) and may expose associated adjacent STI regions 130 (as depicted in the Y1 cross-sectional view).

Further, the backside contact opening 203 may expose the and/or partially removes a portion of an associated backside contact placeholder 160 there above and may further not expose the BDI region 142 there above (e.g., a relatively larger amount of backside ILD 200.1 is retained) and may expose associated adjacent STI regions 130 (as depicted in the Y1 cross-sectional view). This backside ILD 200.1 may be retained and my further electrically isolate the replacement gate structure 170 there above from the backside contact, such as backside contact 205, depicted in FIG. 13, therebelow.

Figure 12:
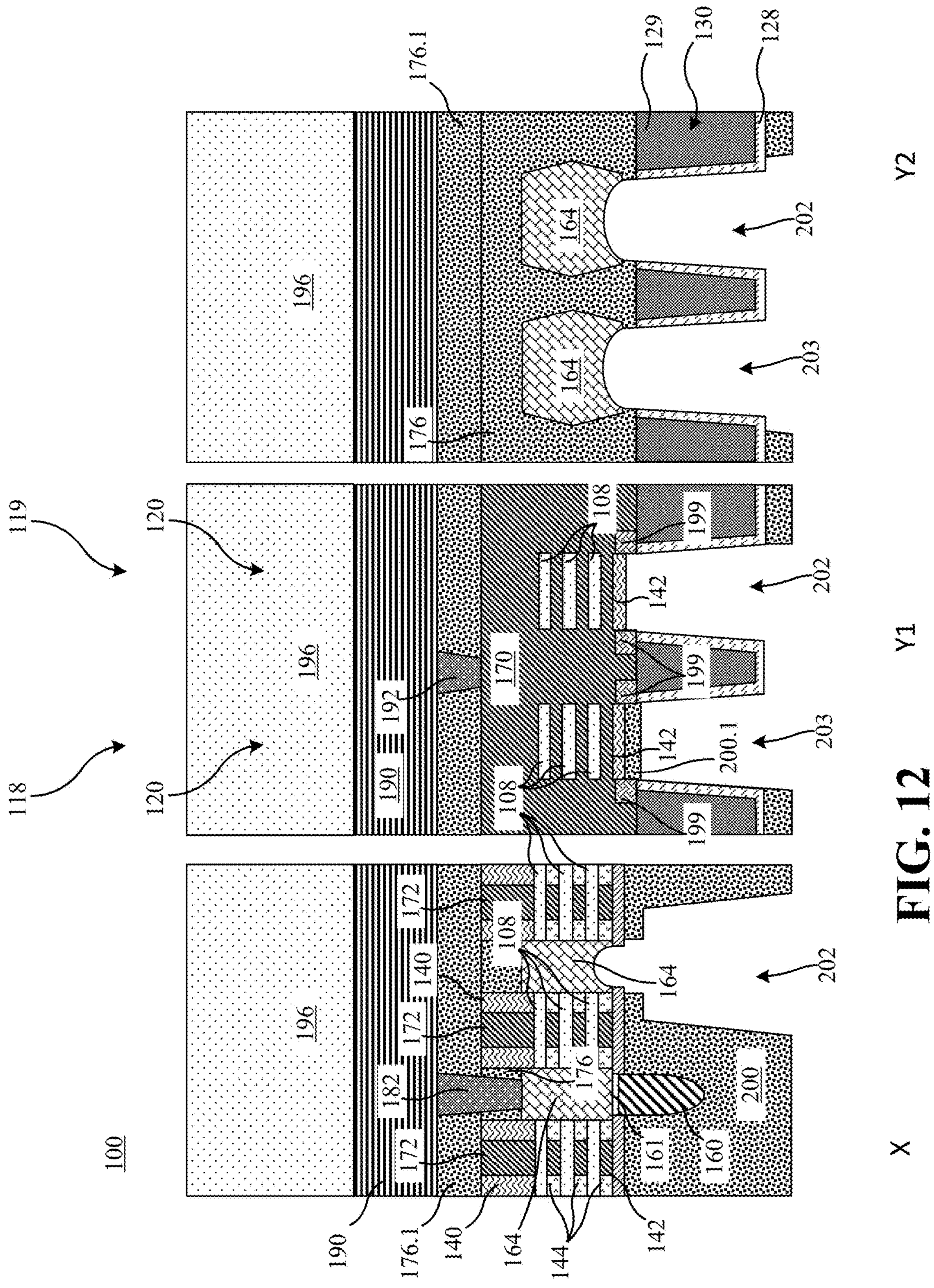

FIG. 12 depicts cross-sectional views of semiconductor IC device 100 shown after exemplary fabrication operation(s), in accordance with one or more embodiments. In the depicted fabrication stage, the backside contact placeholder(s) 160 that are exposed by a respective backside contact opening(s) 202, 203 may be removed, the exposed S/D region(s) 164 may be gouged, and backside contact preclean processes may remove backside ILD 200.2 and may partially remove backside ILD 200.1.

The backside contact placeholder(s) 160 that are exposed by respective backside contact opening(s) 202, 203 may be removed by a substrative removal technique, such as an etch. In one example, the entire applicable contact placeholder(s) 160 may be removed. In another example, the lower portion of the backside contact placeholder is removed using the etch stop layer 161 top surface of the backside contact placeholder 160 as an etch stop to protect the S/D region 164 there above. Optionally, at the present fabrication stage and as depicted, respective etch stop layer(s) 161 may also be removed thereby exposing at least a portion of the S/D region(s) 164 there above.

Optionally, the exposed S/D region(s) 164 may be gouged by a subtractive removal technique, such as an etch. In such process(es), dry and wet etching processes can have etching parameters that can be tuned, such as etchants used, etching temperature, etching solution concentration, etching pressure, source power, RF bias voltage, RF bias power, etchant flow rate, to promote desired S/D region(s) 164 material removal while also retaining the desired S/D region(s) 164.

Further in the depicted fabrication stage, a backside contact preclean process, such as pre-silicide clean may clean the backside of the semiconductor IC device 100 and may remove backside ILD 200.2 and may partially remove backside ILD 200.1. For clarity, in the worst case (e.g., when backside ILD 200.2 is fully removed and the BDI region 142 associated therewith is exposed) the BIE region(s) 199 associated therewith may be adequately formed to electrically isolate the replacement gate structure 170 there above from the backside contact, such as backside contact 204, depicted in FIG. 13, there below.

FIG. 13 depicts cross-sectional views of semiconductor IC device 100 shown after exemplary fabrication operation(s), in accordance with one or more embodiments. In the depicted fabrication stage, a respective backside contact 204, 205 may be formed within a respective backside contact opening 202, 203. Further in the depicted fabrication stage, a planarization process, such as a CMP process or a mechanical grinding process, may remove excess portions of the backside contact(s) 204, 205 may remove excess portions of STI region(s) 130, and may remove excess portions of backside ILD 200, or the like.

Respective backside contact(s) 204, 205 may be formed within a respective backside contact opening(s) 202, 203 by depositing conductive material, such as metal, into the respective backside contact opening(s) 202. In an example, backside contact(s) 204, 205 may be simultaneously formed by depositing a liner, such as Ni, NiPt or Ti, etc. into the backside contact opening(s) 202, 203 depositing an adhesion liner, such as TiN, TaN, etc. upon the liner, and by depositing a conductive fill, such as Al, Ru, W, Co, Cu, etc. upon the adhesion liner.

Subsequently, a planarization process may expose a bottom surface (as depicted) of the STI region(s) 130. Subsequently, the respective bottom surfaces (as depicted) of backside contact(s) 204, 205, STI region(s) 130, and backside ILD 200 may be substantially horizontal and/or substantially coplanar.

FIG. 14 depicts cross-sectional views of semiconductor IC device 100 shown after exemplary fabrication operation(s), in accordance with one or more embodiments. In the depicted fabrication stage, a backside BEOL network 210 may be formed.

The backside BEOL network 210 may be formed over the backside ILD 200 and over one or more backside contact(s) 204, 205. The backside BEOL network 210 may be indirectly electrically and/or indirectly physically connected to the one or more S/D regions 164 by way of a particular backside contact(s) 204, 205. For example, as illustrated, a first group of backside wires 212 (e.g., a backside power wire, backside power rail, etc.) within the backside BEOL network 210 may be connected the backside contact 204. Similarly, a second group of backside wires 214 (e.g., a backside power wire, backside signal wire, backside power rail, etc.) within the backside BEOL network 210 may be connected to a S/D region 164 via backside contact 205.

The backside BEOL network 210 can include one or more interconnect dielectric material layers (including one of the dielectric materials mentioned above for the ILD 176) and contains backside conductive wires and/or interconnects, such as VIAs, embedded therein. In some embodiments, the backside wires within the backside BEOL network 210 are composed of Cu. The backside BEOL network 210 can include “x” numbers of backside metal levels, wherein “x” is an integer starting from 1. If not included in frontside BEOL network 190, backside BEOL network 210 may further contain conductive pads that are connected to one or more of the backside metal wires and may be used to connect the semiconductor IC device 100 to the external and/or higher-level structure.

In an example, signal routing and power routing is effectively split between the frontside BEOL network 190 and the backside BEOL network 210. For example, at least 90% of the frontside metal wires (e.g., furthest from the transistor(s)) are signal routing metal wires and the remainder frontside metal wires which are usually present in metal levels closest to the transistor, can be used as power routing wires. Further in this example, at least 90% of the backside metal wires that are in metal levels closest to the transistor(s) are power routing metal wires and the remainder backside metal wires which are usually present in metal levels furthest away from the transistor, can be used as signal routing wires. Power routing wires may be less dense than signal routing wires. A signal routing wire is defined herein as a conductive feature, such as a wire, trace, or the like, that is configured to electrically carry a functional or logical potential or signal that is to change or is otherwise dynamic over time. A power routing wire is defined herein as a conductive feature, such as a wire, trace, plane, or the like, that is configured to electrically carry power potential. For example, a power routing wire carries or otherwise has a functional power potential, such as VDD, VSS, or the like. For clarity, in some examples, the backside BEOL network 210 may be a backside power distribution network (BSPDN).

The backside BEOL network 210 includes various wiring levels. The wiring levels may alternate between a VIA level and a metal level. To form a VIA level, an associated dielectric passivation layer may be formed, the dielectric passivation layer may be patterned to create a VIA opening therein, and conductive or metal material may be deposited within the VIA opening to form a via contact.

To form a metal level, an associated dielectric passivation layer may be formed, the dielectric passivation layer may be patterned to create a wiring trench therein, and conductive or metal material may be deposited within the wiring trench to form a wire. A wire, such as within a lowest metal level may connect directly one or more VIAs or backside contact(s) 204, 205.

Figure 15:
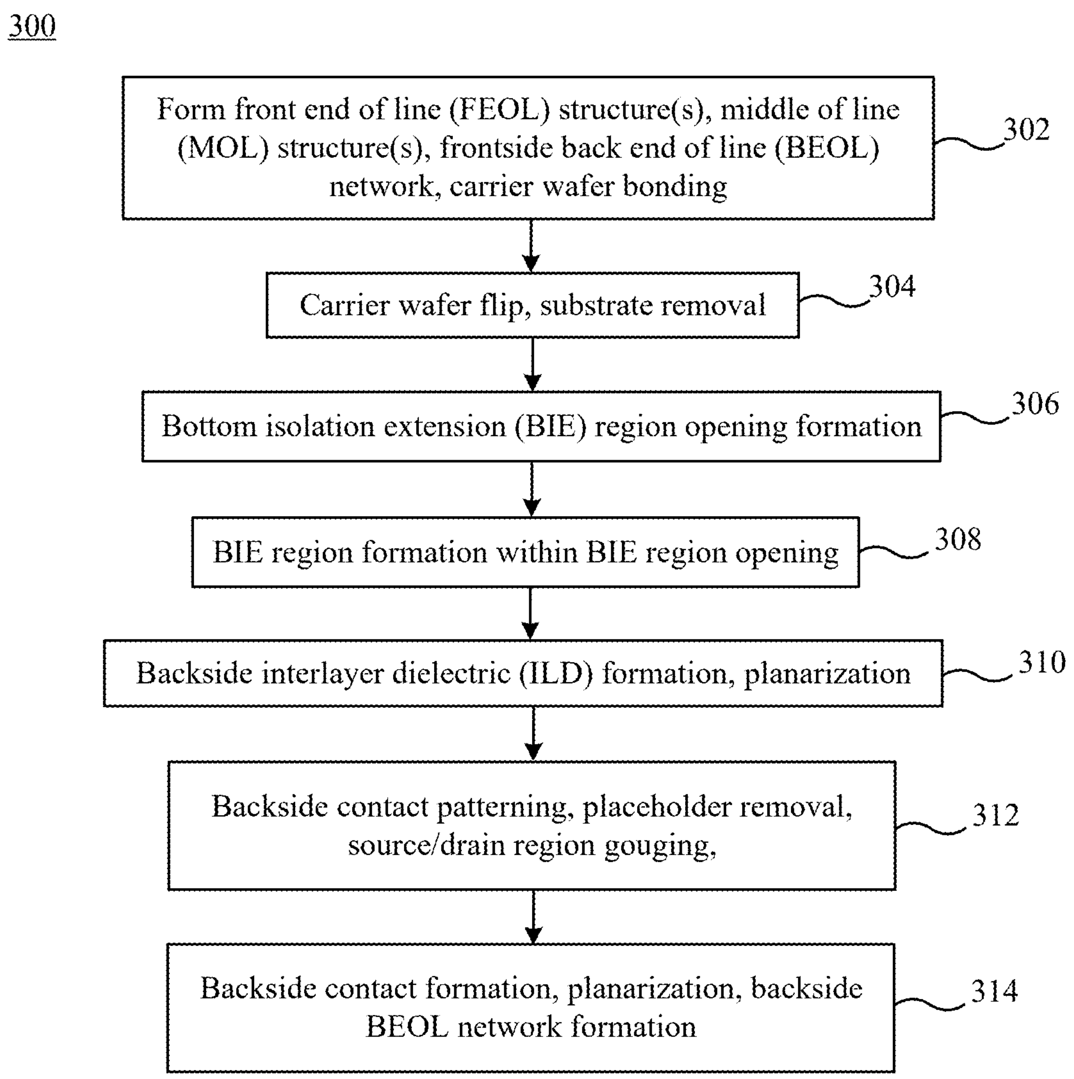
FIG. 15 depicts a method of fabricating a semiconductor IC device that includes one or more BIE regions, according to one or more embodiments of the disclosure.

FIG. 15 depicts a flow diagram illustrating method 300 to fabricate a semiconductor IC device, such as semiconductor IC device 100. The depicted fabrication operations of method 300 are illustratively depicted and described above with reference to one or more of FIG. 3 through FIG. 14 of the drawings, which describe the fabrication of semiconductor IC device 100, though the fabrication operations described in method 300 may be used to fabricate other types of semiconductor IC devices. The method 300 depicted herein is illustrative. There can be many variations to the diagram or operations described therein without departing from the spirit of the embodiments. For instance, the operations can be performed in a differing order, or operations can be added, deleted, or modified.

At block 302, method 300 may begin with forming one or more front end of line (FEOL) microdevices, such as transistors, with forming middle of line (MOL) structures, such as frontside contact(s), with forming a frontside back end of line (BEOL) network, and with attaching a carrier wafer thereto. For example, one or more transistors, such as GAA FETs, are formed, one or more frontside contacts are formed that may contact with components or regions of the one or more transistors, a frontside BEOL network is formed upon the one or more frontside contacts, and a carrier wafer is bonded to the frontside BEOL network.

At block 304, the semiconductor IC device may be flipped, and a substrate associated with the FEOL microdevice may be removed. For example, a lower substrate of a substrate structure may be removed, an etch stop layer of the substrate structure may be removed, and an upper substrate of the substrate structure may be at least partially removed.

At block 306, method 300 may continue with forming bottom isolation extension (BIE) region openings within a respective gate structure or other electrode of the one or more FEOL microdevices. For example, one or more BIE region openings may be formed by a horizontal or lateral indentation etch or other selective removal of an associated replacement gate structure 170 material(s) that are exposed by the removal of the substrate structure. As the BIE region openings are formed within the replacement gate structure, the BIE region openings may be in line with that replacement gate structure. Respective BIE region opening(s) may expose at least a portion of a bottom isolation structure of the FEOL microdevices. The bottom isolation structure may be below a series of vertically arranged channels of the transistors. In an example, the BIE region openings may remove a portion of the gate conductive material that is located at the bottom of the gate and adjacent to the bottom isolation structure (e.g., this implementation may result in a portion 197 of the gate material(s) being retained upon an STI region between transistors). In another example, various BIE region openings may effectively merge together to remove an entire lower or bottom portion of the gate conductive material.

At block 308, method 300 may continue with forming a BIE region within a respective BIE region opening. For example, a dielectric material is deposited within the one or more BIE region openings.

At block 310, method 300 may continue with forming a backside ILD. For example, the backside ILD may be deposited over the one or more BIE regions, over the bottom isolation structure(s), over backside placeholders, over STI region(s), or the like. The backside ILD may be subsequently planarized creating a substantially horizontal and/or substantially coplanar backside surface of the semiconductor IC device.

At block 312, method 300 may further continue with forming one or more backside contact openings within the backside ILD, with removing respective backside contact placeholders of the FEOL microdevice(s) that are exposed by a backside contact opening, and with gouging a source/drain region of the FEOL microdevice(s).

At block 314, method 300 may further continue with forming a backside contact within a respective backside contact opening and with forming a backside BEOL network over the backside contact(s). For example, a backside contact may be formed within a particular backside opening. Subsequently, a CMP process may remove excess backside contact material and a backside BEOL network may be formed upon the planarized backside of semiconductor IC device.

FIG. 16 depicts cross-section views of a semiconductor IC device 400 that includes one or more BIE regions 199, according to one or more embodiments of the disclosure. Semiconductor IC device 400 is an illustrative semiconductor IC device in which the BIE openings 198 effectively merge and remove a bottom portion of the associate replacement gate structure 170 such that the resulting BIE region(s) 199 exist along the bottom of the replacement gate structure generally above the STI region(s) 130 (e.g., the bottom surface of the replacement gate structure 170 is above the STI region(s) and/or gate portions 197 are not resultantly formed). Further, semiconductor IC device 400 is an illustrative semiconductor IC device in which the bottom isolator structure is a bottom spacer isolator (BSI) 142' that may be formed along with the inner spacers 144, and therefore may be the same dielectric material relative thereto. Such semiconductor IC device 400 may be fabricated by retaining the bottom sacrificial nanolayer 104 while the gate spacer(s) 140 are formed and later removing the bottom sacrificial nanolayer 104 during the removal of the sacrificial nanolayers 106. Because the bottom sacrificial nanolayer 104 and the sacrificial nanolayers 106 are formed of the materials with different etch rates, the resulting horizontal indent associated with the bottom sacrificial nanolayer 104 may be relatively larger, as depicted by the resulting BSI 142' protruding past a sidewall of the replacement gate structure 170 towards the center of the replacement gate structure 170.

Semiconductor IC device 100, 400 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit (IC) device comprising:
- a transistor comprising a plurality of nanosheet channels;
- a bottom isolation structure below the plurality of nanosheet channels;
- a bottom isolation extension (BIE) region in direct contact against at least a sidewall of the bottom isolation structure; and
- a gate structure in direct contact against the BIE region and in direct contact against the plurality of nanosheet channels, wherein a bottom surface of the BIE region is substantially coplanar with a bottom surface of the gate structure.

2. The semiconductor IC device of claim 1, further comprising:
- a source/drain (S/D) region in direct contact against the plurality of nanosheet channels; and
- a backside contact in direct contact against the S/D region.

3. The semiconductor IC device of claim 2, wherein the BIE region is further in direct contact against the backside contact.

4. The semiconductor IC device of claim 3, further comprising:
- a backside back end of line (BEOL) network in direct contact against the backside contact.

5. The semiconductor IC device of claim 4, further comprising:
- a shallow trench isolation (STI) region underneath the gate structure.

6. The semiconductor IC device of claim 5, wherein a top surface of the STI region is substantially coplanar with the bottom surface of the gate structure, and wherein the top surface of the STI region is below a bottom surface of the bottom isolation structure.

7. The semiconductor IC device of claim 6, wherein the STI region is in direct contact against the backside contact.

8. The semiconductor IC device of claim 1, wherein the BIE region is composed of a first material, wherein the bottom isolation structure is composed of a second material, and wherein the first material is different than the second material.

9. A semiconductor integrated circuit (IC) device comprising:
- a first transistor associated with a first active region, the first transistor comprising a first plurality of nanosheet channels, a first bottom isolation structure below the first plurality of nanosheet channels, and a first bottom isolation extension (BIE) region in direct contact against at least a sidewall of the first bottom isolation structure;
- a second transistor associated with a second active region, the second transistor comprising a second plurality of nanosheet channels, a second bottom isolation structure below the second plurality of nanosheet channels, and a second BIE region in direct contact against at least a sidewall of the second bottom isolation structure;
- a shallow trench isolation (STI) region between the first active region and the second active region; and
- a gate structure in direct contact against the first BIE region, in direct contact against the first plurality of nanosheet channels, in direct contact against the second BIE region, in direct contact against the second plurality of nanosheet channels, and in direct contact against the STI region, wherein a bottom surface of the first BIE region, a bottom surface of the second BIE region, and a bottom surface of the gate structure are substantially coplanar.

10. The semiconductor IC device of claim 9, wherein the first transistor further comprises a first source/drain (S/D) region in direct contact against the first plurality of nanosheet channels; and wherein the second transistor further comprises a second S/D region in direct contact against the second plurality of nanosheet channels.

11. The semiconductor IC device of claim 10, further comprising:
- a first backside contact in direct contact against the first S/D region; and
- a second backside contact in direct contact against the second S/D region.

12. The semiconductor IC device of claim 11, further comprising a backside interlayer dielectric (ILD), wherein the first BIE region is further in direct contact against the first backside contact, and wherein the backside ILD is between the second BIE region and a second S/D contact.

13. The semiconductor IC device of claim 12, further comprising:
- a backside back end of line (BEOL) network in direct contact against the first backside contact and in direct contact against the second S/D contact.

14. The semiconductor IC device of claim 9, wherein a top surface of the STI region is substantially coplanar with the bottom surface of the gate structure, and wherein the top surface of the STI region is below a bottom surface of the first bottom isolation structure and the second bottom isolation structure.

15. The semiconductor IC device of claim 14, wherein the STI region is in direct contact against the first backside contact and is in direct contact against the second backside contact.

16. The semiconductor IC device of claim 9, wherein the first BIE region and the second BIE region are composed of a first material, wherein the first bottom isolation structure composed of a second material, and wherein the first material is different than the second material.

17. A semiconductor integrated circuit (IC) device fabrication method comprising:
- forming a gate structure upon and around channels and upon a bottom isolation structure of a first transistor;
- forming a bottom isolation extension (BIE) region opening within the gate structure, the BIE region opening exposing at least a sidewall of the bottom isolation structure; and
- forming a BIE region by depositing dielectric material within the BIE region opening, wherein a bottom surface of the BIE region is substantially coplanar with a bottom surface of the gate structure.

18. The semiconductor IC device fabrication method of claim 17, wherein the BIE region is in direct contact against the sidewall of the bottom isolation structure and is indirect contact with the gate structure.

* * * * *